United States Patent
Kanazawa

(10) Patent No.: US 12,542,530 B2
(45) Date of Patent: Feb. 3, 2026

(54) ACOUSTIC WAVE DEVICE, FILTER, BRANCHING APPARATUS, AND COMMUNICATION DEVICE

(71) Applicant: KYOCERA Corporation, Kyoto (JP)

(72) Inventor: Tomio Kanazawa, Daito (JP)

(73) Assignee: KYOCERA CORPORATION, Kyoto (JP)

( * ) Notice: Subject to any disclaimer, the term of this patent is extended or adjusted under 35 U.S.C. 154(b) by 97 days.

(21) Appl. No.: 18/578,935

(22) PCT Filed: Jul. 8, 2022

(86) PCT No.: PCT/JP2022/027084
§ 371 (c)(1),
(2) Date: Jan. 12, 2024

(87) PCT Pub. No.: WO2023/286705
PCT Pub. Date: Jan. 19, 2023

(65) Prior Publication Data
US 2024/0322785 A1    Sep. 26, 2024

(30) Foreign Application Priority Data

Jul. 14, 2021 (JP) .................................. 2021-116224

(51) Int. Cl.
*H03H 9/02* (2006.01)
*H03H 9/64* (2006.01)

(52) U.S. Cl.
CPC .... *H03H 9/02992* (2013.01); *H03H 9/02818* (2013.01); *H03H 9/6483* (2013.01)

(58) Field of Classification Search
CPC ........... H03H 9/02992; H03H 9/02818; H03H 9/6483; H03H 9/02574; H03H 9/14544;
(Continued)

(56) References Cited

U.S. PATENT DOCUMENTS

2019/0131954 A1    5/2019  Okada
2020/0076404 A1 *  3/2020  Takigawa ........... H03H 9/14532
2020/0304096 A1    9/2020  Suzuki et al.

FOREIGN PATENT DOCUMENTS

JP    2021-083132 A    5/2021
WO    2018003338 A1    1/2018

* cited by examiner

*Primary Examiner* — Jorge L Salazar, Jr.
(74) *Attorney, Agent, or Firm* — Volpe Koenig

(57) ABSTRACT

An acoustic wave device in which multiple second electrode fingers are connected to a different potential from multiple first electrode fingers and arranged in an alternating manner with the multiple first electrode fingers in a propagation direction of acoustic waves. The acoustic wave device includes a crossing region in which the multiple first electrode fingers and the multiple second electrode fingers overlap in the propagation direction of acoustic waves. The crossing region includes first to third regions. The first region is located at tip sides of the multiple first electrode fingers. The second region is located more centrally than the first region in the direction in which the multiple first electrode fingers and the multiple second electrode fingers extend and has a higher acoustic velocity than the first region. The third region is located more centrally than the second region and has a higher acoustic velocity than the second region.

19 Claims, 11 Drawing Sheets

(58) Field of Classification Search
CPC ........ H03H 9/1457; H03H 9/145; H03H 9/25; H03H 9/64; H03H 9/72
USPC .................................................. 333/193–196
See application file for complete search history.

ACOUSTIC WAVE DEVICE, FILTER, BRANCHING APPARATUS, AND COMMUNICATION DEVICE

TECHNICAL FIELD

The present disclosure relates to an acoustic wave device capable of at least one out of converting acoustic waves to electrical signals and converting electrical signals to acoustic waves, a filter including the acoustic wave device, a splitter including the filter, and a communication device including the splitter.

BACKGROUND OF INVENTION

A known acoustic wave device includes a piezoelectric layer and an interdigital transducer (IDT) electrode positioned on the piezoelectric layer (for example, Patent Literature 1 listed below). The IDT electrode includes a pair of comb electrodes. Each comb electrode includes a busbar and multiple electrode fingers extending parallel to each other from the busbar. The pair of comb electrodes are disposed so as to mesh with each other. The region where the multiple electrode fingers of one comb electrode and the multiple electrode fingers of the other comb electrode overlap in the direction in the propagation direction of acoustic waves is called a crossing region or the like, and plays an important role in the propagation of acoustic waves.

In Patent Literature 1, the crossing region includes low-acoustic-velocity regions on both sides in the direction in which the multiple electrode fingers extend and a high-acoustic-velocity region in the center in the direction in which the multiple electrode fingers extend. The acoustic velocity in the low-acoustic-velocity regions is lower than the acoustic velocity in the high-acoustic-velocity region. This configuration allows a so-called piston mode to be used, and this in turn reduces transverse mode spurious.

CITATION LIST

Patent Literature

Patent Literature 1: Japanese Unexamined Patent Application Publication No. 2021-83132

SUMMARY

In an embodiment of the present disclosure, an acoustic wave device includes a piezoelectric body having a first surface and an IDT electrode positioned on the first surface. The IDT electrode includes multiple first electrode fingers and multiple second electrode fingers. The multiple second electrode fingers are connected to a different potential from the multiple first electrode fingers and are arranged in an alternating manner with the multiple first electrode fingers in a propagation direction of acoustic waves. In a crossing region, the multiple first electrode fingers and the multiple second electrode fingers overlap each other in the propagation direction of acoustic waves. The crossing region includes a first region, a second region, and a third region. The first region is located at tip sides of the multiple first electrode fingers. The second region is located more centrally than the first region in a direction in which the multiple first electrode fingers and the multiple second electrode fingers extend and has a higher acoustic velocity than the first region. The third region is located more centrally than the second region and has a higher acoustic velocity than the second region.

In an embodiment of the present disclosure, a filter includes the acoustic wave device and one or more other IDT electrodes located on the first surface, connected to the IDT electrode in a ladder configuration, and constituting a ladder filter.

In an embodiment of the present disclosure, a filter includes the acoustic wave device and one or more other IDT electrodes located on the first surface, arranged in the propagation direction of acoustic waves with respect to the IDT electrode, and constituting a multi-mode filter.

In an embodiment of the present disclosure, a splitter includes an antenna terminal, a transmission filter, and a reception filter. The transmission filter and the reception filter are connected to the antenna terminal. At least one out of the transmission filter and the reception filter is constituted by either of the above filters.

In an embodiment of the present disclosure, a communication device includes the splitter, an antenna, and an integrated circuit (IC). The antenna is connected to the antenna terminal. The IC is connected to the transmission filter and the reception filter.

DESCRIPTION OF EMBODIMENTS

Figure 1:
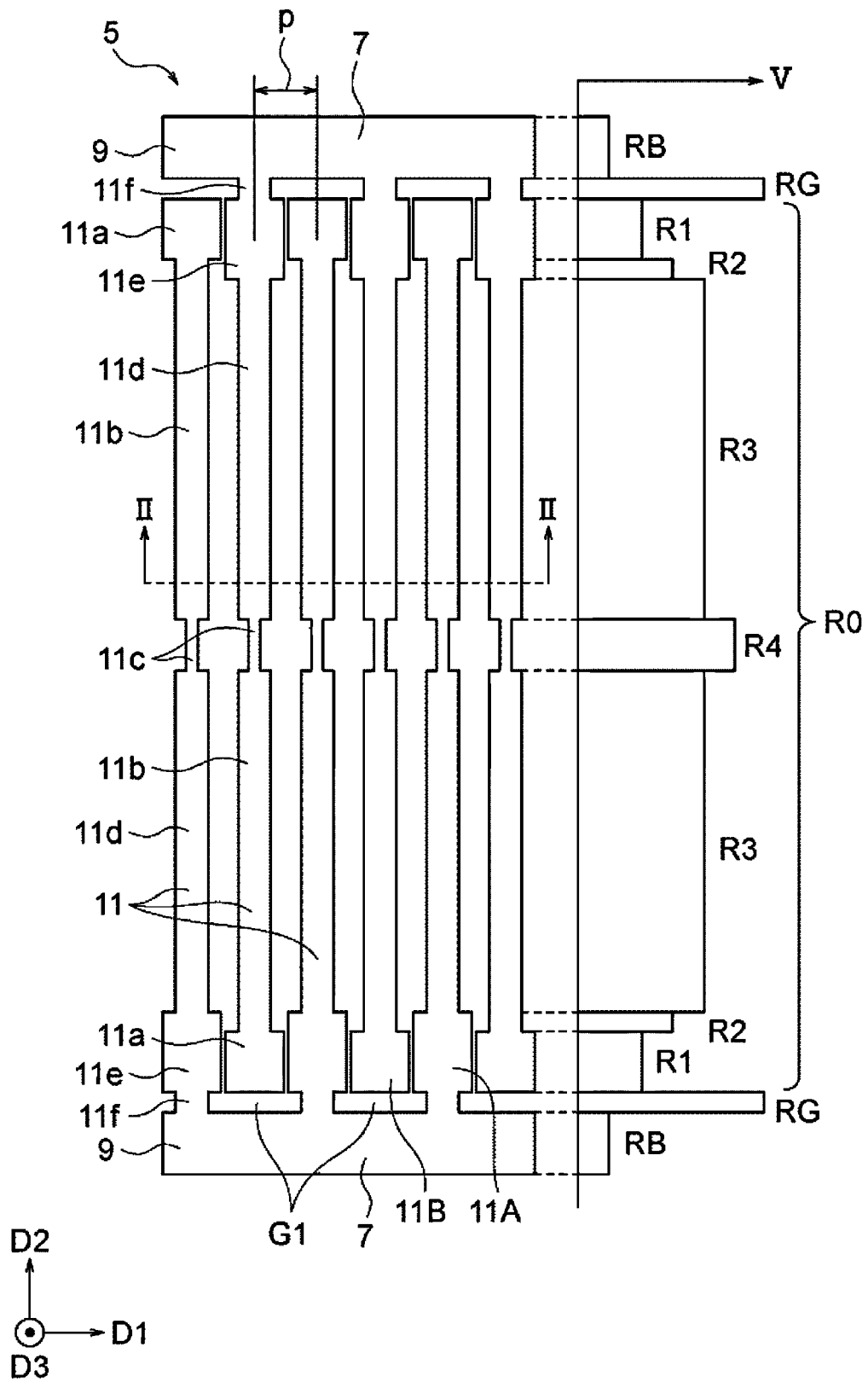
FIG. 1 is a plan view illustrating the configuration of an acoustic wave device according to a First Embodiment.

Hereafter, embodiments according to the present disclosure will be described while referring to the drawings. The drawings used in the following description are schematic drawings. The dimensional ratios and so on in the drawings do not necessarily match the actual dimensional ratios and so on. There may be cases where the dimensional ratios and so on do not match between the drawings. Certain shapes or dimensions may be illustrated in an exaggerated fashion.

Any direction may be considered up or down with respect to the acoustic wave device according to the present disclosure. However, for convenience, a Cartesian coordinate system consisting of a D1 axis, a D2 axis, and a D3 axis is defined below, and terms such as top surface or bottom surface may be used, with the positive side of the D3 axis being on the upper side. When terms such as viewed in plan view or viewed in planar perspective view are used, we mean looking in the D3 direction, unless otherwise noted. The D1 axis is defined as parallel to the propagation direction of acoustic waves propagating along the top surface of a piezoelectric body, which will be described below, the D2 axis is defined as parallel to the top surface of the piezoelectric body and perpendicular to the D1 axis, and the D3 axis is defined as perpendicular to the top surface of the piezoelectric body.

In embodiments described after the description of the First Embodiment, basically, only the parts that differ from the previously described embodiments will be described. Matters not specifically mentioned may be assumed to be the same as those in the previously described embodiments, or may be inferred from the previously described embodiments.

First Embodiment (Overview of Acoustic Wave Device)

FIG. 1 is a plan view illustrating main parts of an acoustic wave device 1 according to an embodiment (hereafter, may be simply referred to as a "device 1"). In this figure, a velocity profile of the device 1 is also illustrated, as described later.

The device 1 includes, for example, a piezoelectric body 3 (refer to FIG. 2 and so on described later) and an IDT electrode 5 positioned on a top surface 3a (example of a first surface) of the piezoelectric body 3. FIG. 1 is a plan view of the top surface 3a. However, symbols relating to the piezoelectric body 3 and illustration of the outer edge of the top surface 3a and so on are omitted.

Acoustic waves that propagate in the D1 direction through a crossing region R0 of the piezoelectric body 3 are excited by applying a voltage to the IDT electrode 5. And/or when acoustic waves propagate in the D1 direction through the crossing region R0, charge is generated in the piezoelectric body 3 and a voltage is applied to the IDT electrode 5. The device 1 may, for example, be included in a resonator and/or a filter that utilizes this kind of conversion between acoustic waves and a voltage (electrical signal). Hereafter, the D1 direction may be referred to as a propagation direction of acoustic waves or a propagation direction, and so on.

On the right-hand side of FIG. 1, a graph depicting the acoustic velocity profile of the device 1 is illustrated. An axis parallel to the D2 direction in the graph represent the position in the IDT electrode 5 in the D2 direction, and corresponding positions are connected by dotted lines. An axis parallel to the D1 direction represents acoustic velocity V. Along this axis, the right side of FIG. 1 (the +D1 side) corresponds to the side with the higher acoustic velocity.

The graph on the right side of FIG. 1 only illustrates the ranking of acoustic velocities in multiple regions. In other words, the actual values are not reflected in the absolute values of the acoustic velocity in each region, the difference in acoustic velocity between multiple regions, and the ratio of acoustic velocity between multiple regions. In FIG. 1, the shape of parts of the IDT electrode 5 is exaggerated, and therefore discrepancies occur between the dimensional ratio of the IDT electrode 5 and the velocity profile, which will be discussed in more detail later.

In a general acoustic wave device, the acoustic velocity in the crossing region R0 is constant across the entire region. In acoustic wave devices that use a so-called piston mode, the crossing region R0 includes a high-acoustic-velocity region in the center in the D2 direction and low-acoustic-velocity regions positioned on both sides of the high-acoustic-velocity region in the D2 direction. In other words, two types of regions having different acoustic velocities from each other are formed within the crossing region R0.

On the other hand, in the acoustic wave device 1 according to the embodiment, three or more types of regions having different acoustic velocities from each other are formed within the crossing region R0. In the illustrated example, four types of regions, namely, first to fourth regions R1 to R4 are formed. In this way, for example, transverse mode spurious can be reduced.

In a First Embodiment, the regions where the acoustic velocities are different from each other are realized by using a novel planar shape for the IDT electrode 5. In other words, the rest of the configuration may be realized in various ways, for example, may be realized in known ways. In the description of the First Embodiment, the description will generally be given in the following order.

(1) Overview of IDT Electrode (FIG. 1)
(2) Overview of Velocity Profile (FIG. 1)
(3) Details of Planar Shape of IDT Electrode (FIG. 1)
(4) Example of Dimensions of Each Part of Electrode Fingers (described later) of IDT Electrode (FIG. 1)
(5) Various Example Configurations of Substrates Including Piezoelectric Body (FIGS. 2 and 3)
(6) Other Configurations of Acoustic Wave Devices
(7) Summary of First Embodiment In the description of (1) above, the IDT electrode 5 will be described using the configuration illustrated in FIG. 1 as an example for matters that may be regarded as being known. However, the description may include a description of a novel configuration without specifically stating that this is the case. In the description of (3) above, the planar shape of the IDT electrode 5 in relation to the velocity profile is described.

(Overview of IDT Electrode)

The IDT electrode 5 is composed of a conductor layer stacked on the top surface 3a of the piezoelectric body 3. The IDT electrode 5 includes a pair of comb electrodes 7. Each comb electrode 7 includes, for example, a busbar 9 and multiple electrode fingers 11 extending parallel to each other from the busbar 9. In the following description, the electrode fingers 11 of one comb electrode 7 (the electrode fingers 11 extending from the busbar 9 on the −D2 side toward the +D2 side in FIG. 1) may be referred to as first electrode fingers 11A. In addition, the electrode fingers 11 of the other comb electrode 7 (electrode fingers 11 extending from busbar 9 on +D2 side toward −D2 side in FIG. 1) may be referred to as second electrode fingers 11B.

The pair of comb electrodes 7 is disposed so that multiple electrode fingers 11 mesh with each other (cross each other). In other words, the multiple first electrode fingers 11A and the multiple second electrode fingers 11B are arranged in an alternating manner so as to be inserted between one another. In this case, the multiple first electrode fingers 11A and the multiple second electrode fingers 11B may be arranged in an alternating manner one by one (illustrated example), or may be arranged in an alternating manner in groups of two or more. There may be different parts resulting from so-called thinning or the like. In the description of this embodiment, a configuration in which the electrode fingers are arranged in an alternating manner one by one will be taken as an example.

The busbars 9 are, for example, formed in a generally long shape having a constant width and extending in a straight line in the propagation direction of acoustic waves (D1 direction). The pair of busbars 9 face each other in a direction (D2 direction) perpendicular to the propagation direction of acoustic waves. The busbars 9 may vary in width or be inclined with respect to the propagation direction of acoustic waves.

The multiple electrode fingers 11 have the same shape and dimensions as each other, for example. Each electrode finger 11 is, for example, formed in a generally long shape with the centerline thereof extending in a straight line in a direction (D2 direction) perpendicular to the propagation direction of acoustic waves.

The multiple electrode fingers 11 are arranged in the propagation direction. Note that when we say that the electrode fingers are arranged in the propagation direction, a line (not illustrated) connecting the tips (or bases) of the multiple first electrode fingers 11A (or multiple second electrode fingers 11B) may be parallel to the propagation direction (illustrated example) or may be not parallel to the propagation direction. The crossing region R0 need only be configured so that the adjacent electrode fingers 11 overlap each other in the propagation direction.

A pitch p of the multiple electrode fingers 11 (for example, the distance between the centers of two adjacent electrode fingers 11) is basically constant within the IDT electrode 5. Note that the IDT electrode 5 may include some parts that are different in terms of the pitch p. Examples of such different parts include, for example, small pitch parts where the pitch p is smaller than that for the majority (for example, 80% or more) of the electrode fingers 11, large pitch parts where the pitch p is larger than that for the majority of the electrode fingers 11, and thinned parts where a small number of electrode fingers 11 have been substantially thinned out.

Hereafter, when the pitch p is referred to, unless otherwise specified, the pitch p refers to the pitch of the parts (majority of the multiple electrode fingers 11) excluding the different parts described above. In addition, in the case where the pitch changes even in the majority of the multiple electrode fingers 11 excluding the different parts, the average value of the pitch of the majority of the electrode fingers 11 may be used as the value of the pitch p.

The number of electrode fingers 11 may be set as appropriate in accordance with the electrical characteristics and so forth required for the IDT electrode 5 (device 1). FIG. 1 is a schematic diagram, and therefore a small number of the electrode fingers 11 are illustrated. In reality, a greater number of electrode fingers 11 may be arranged than is illustrated in the figure. For example, the number of electrode fingers 11 may be 100 or more. FIG. 1 may be considered to be an illustration of an extracted portion of the IDT electrode 5.

The tip of each electrode finger 11 faces an edge of the busbar 9 to which the electrode finger 11 is not connected across a gap G1. The lengths of the multiple gaps G1 in the D2 direction are identical to each other, for example.

When a voltage is applied to the pair of comb electrodes 7, the voltage is applied to the top surface 3a of the piezoelectric body 3 by the multiple electrode fingers 11, thereby causing the top surface of the piezoelectric body 3 to vibrate (if the piezoelectric body 3 is relatively thick) or causing the entire piezoelectric body 3 to vibrate (if the piezoelectric body 3 is relatively thin). This causes acoustic waves that propagate along the top surface 3a to be excited. When half the wavelength of the acoustic waves is approximately equal to the pitch p, the multiple acoustic waves excited by the multiple electrode fingers 11 are in phase with each other in a direction (D1 direction) perpendicular to the multiple electrode fingers 11 and the amplitudes of the acoustic waves add together. In other words, when the pitch p is set to half the wavelength, acoustic waves propagating in the D1 direction are most easily excited. As a result, out of the voltage applied to the IDT electrode 5, mainly, a component having a frequency equivalent to the frequency of acoustic waves, whose half wavelength is roughly equal to the pitch p, is converted into acoustic waves. In addition, when acoustic waves are generated in the region of the top surface 3a where the pair of comb electrodes 7 are disposed, mainly, acoustic waves propagating in the D1 direction, whose half wavelength is roughly equal to the pitch p, are converted into a voltage through the a principle opposite to that described above. A resonator or filter is realized by using these principles.

As is clear from the above description, the pair of comb electrodes 7 are connected to different potentials from each other. The first electrode fingers 11A and the second electrode fingers 11B can be regarded as electrode fingers 11 that are connected to different potentials from each other.

In the device 1, acoustic waves of any appropriate mode may be utilized. For example, the acoustic waves may be surface acoustic waves (SAWs). For example, Rayleigh waves or leaky waves may be used as the SAWs. The acoustic waves may be Lamb waves propagating through a thin-plate-shaped piezoelectric body. For example, as Lamb waves, A1-mode Lamb waves, S0-mode Lamb waves, and shear horizontal (SH) Lamb waves may be used. The modes of acoustic waves do not need to be clearly identifiable or distinguishable in this way.

The pitch p of the electrode fingers 11 is basically half the wavelength of acoustic waves that have a frequency equivalent to the intended resonant frequency, as described above. An example of the absolute value of the pitch p is greater than or equal to 0.5 μm and less than or equal to 15 μm. The length of the electrode fingers 11 may be, for example, greater than or equal to 10p or 20p, and may be less than or equal to 100p or 50p. The above lower and upper limits may be used in combination as appropriate.

The thickness of the IDT electrode 5 (conductor layer) is, for example, generally constant regardless of the position in a planar direction (direction parallel to D1-D2 plane). The thickness of the conductor layer may be set as appropriate in accordance with the characteristics required for the device 1. For example, the thickness of the conductor layer may be greater than or equal to 0.04p and less than or equal to 0.20p, and/or greater than or equal to 50 nm and less than or equal to 600 nm.

The conductor layer is formed using a metal, for example. The metal may be any suitable metal and, for example, may be aluminum (Al) or an alloy having Al as a main component (Al alloy). The Al alloy is, for example, an Al-copper (Cu) alloy. The conductor layer may be composed of multiple metal layers. For example, the conductor layer may be composed of a relatively thin layer of titanium (Ti) stacked on the top surface 3a of the piezoelectric body 3 and an Al or Al alloy stacked on the Ti layer. Ti, for example, contributes to strengthening the bond between the Al or Al alloy and the piezoelectric body 3.

Overview of Velocity Profile

When the top surface 3a of the piezoelectric body 3 is viewed in plan view, the region where the IDT electrode 5 is disposed can be divided into the following three types of regions in the D2 direction based on the configuration of the IDT electrode 5. The crossing region R0 in which the multiple first electrode fingers 11A and the multiple second electrode fingers 11B overlap in propagation direction of acoustic waves. Gap regions RG in which the gaps G1 are positioned. Busbar regions RB in which the busbars 9 are positioned.

The crossing region R0 may be regarded as a region that is interposed between a line (not illustrated) connecting the tips of the multiple first electrode fingers 11A to each other and a line (not illustrated) connecting the tips of the multiple second electrode fingers 11B to each other. If the positions of the above lines and so on differ depending on what position within the width of the electrode fingers 11 is used as a reference when assuming lines connecting prescribed parts (for example, the tips) of the multiple electrode fingers 11, the center lines of the electrode fingers 11 may be used as a reference.

In the illustrated example, the line connecting the tips of the multiple first electrode fingers 11A and the line connecting the tips of the multiple second electrode fingers 11B are straight lines that are parallel to each other. In other words, the crossing region R0 has a quadrangular shape. More precisely, the lines connecting the tips are perpendicular to the electrode fingers 11, and thus, the crossing region R0 has a rectangular shape with sides parallel to the D1 direction. The rectangle is, for example, a rectangle that is long in the D1 direction, unlike in FIG. 1. The crossing region R0 can alternatively be any shape other than a rectangular shape. For example, the crossing region R0 may be shaped like a parallelogram with the lines connecting the tips being inclined with respect to the D1 direction.

The description of the various regions (R0, R1 to R4, RG, and RB) in the description of this embodiment may apply to only part of the IDT electrode, in the D1 direction. For example, in the illustrated example, the line connecting the tips of the multiple first electrode fingers 11A is a straight line extending across all the first electrode fingers 11A. However, the line connecting the tips of the multiple first electrode fingers 11A may be straight line for only a prescribed number (for example, 10) or more of the first electrode fingers 11A. In other words, the effect achieved in this embodiment may be obtained in only part of the IDT electrode in the D1 direction. Therefore, for example, various regions of the IDT electrode as a whole may extend in the D2 direction in a V-shape or the like.

The gap region RG may be considered as a region interposed between the line connecting the tips of the multiple first electrode fingers 11A (or the multiple second electrode fingers 11B) and the edge of the busbar 9 opposite the tips of the multiple first electrode fingers 11A. In the illustrated example, the gap region RG has a rectangular shape with long sides parallel to the D1 direction. However, the gap region RG can alternatively be any shape other than a rectangular shape. For example, when the crossing region R0 is shaped like a parallelogram as described above, the gap region RG may be shaped like a parallelogram with four sides that are respectively parallel to the four sides of the crossing region R0.

The busbar region RB may be regarded as a region interposed between the edge of the busbar 9 on the side where the electrode fingers 11 are located and the opposite edge of the busbar 9. In the illustrated example, the busbar region RB has a rectangular shape with long sides parallel to the D1 direction. However, the busbar region RB can alternatively be any shape other than a rectangular shape. For example, when the crossing region R0 and the gap region RG are shaped like parallelograms as described above, the busbar region RB may be shaped like a parallelogram with four sides parallel to the four sides of the crossing region R0. The busbar region RB may be shaped like a trapezoid with the edge on side where the gap region RG is located serving as the bottom.

As already mentioned, the crossing region R0 includes the first to fourth regions R1 to R4, which have different acoustic velocities from each other. The term "acoustic velocity" used here may be, for example, the velocity at which the acoustic waves of the mode utilized by the device 1 propagate through the piezoelectric body 3. However, normally, when multiple regions are defined based on the shape of the IDT electrode 5 and so on, the relationship between the magnitudes of the acoustic velocity in the multiple regions is not reversed with the difference in the specific mode of the acoustic waves utilized. Therefore, there is no need to identify which mode the acoustic velocity of the acoustic wave corresponds to.

The acoustic velocity of the acoustic waves is affected by the mass of a member (for example, the IDT electrode 5) positioned on the top surface 3a of the piezoelectric body 3. For example, in each region, the greater the mass per unit area, the lower the acoustic velocity. On the other hand, if the thickness of the conductor layer constituting the IDT electrode 5 is constant, the larger the ratio of the area of the conductor layer to the unit area, the larger the mass per unit area. Therefore, the acoustic velocity is lower in regions where the area percentage of the conductor layer constituting the IDT electrode 5 is larger.

In the illustrated example, the width (length in the D1 direction) of the electrode fingers 11 is not constant. In this way, the first to fourth regions R1 to R4 having different acoustic velocities are formed. These regions are arranged in the order of the first region R1, the second region R2, the third region R3, and the fourth region R4 from both sides of the crossing region R0 in the D2 direction toward the center. If these regions are listed in order from the region having the lowest acoustic velocity, the regions are listed in the order of the first region R1, the second region R2, the third region R3, and the fourth region R4. In other words, the acoustic velocity increases with increasing proximity to the region in the center.

From another perspective, the first regions R1 are positioned at both sides (specifically, at both ends) of the crossing region R0 in the D2 direction. The second regions R2 are positioned more centrally in the crossing region R0 in the D2 direction than the first regions R1 (specifically, adjacent to and toward the center from the first regions R1) and have a higher acoustic velocity than the first regions R1. The third regions R3 are positioned more centrally in the crossing region R0 in the D2 direction than the second regions R2 (specifically, adjacent to and toward the center from the second regions R2) and have a higher acoustic velocity than the second regions R2. The fourth region R4 is positioned more centrally in the crossing region R0 in the D2 direction than the third regions R3 (specifically, adjacent to and toward the center from the second regions R2 and located centrally in the crossing region R0) and has a higher acoustic velocity than the third regions R3.

In this paragraph, a line connecting points in the center of the length of the crossing region R0 in the D2 direction is referred to as a center line of the crossing region R0. The two first regions R1, for example, are at the same distance from the center line of the crossing region R0 (distance in the D2 direction from the center line) and have the same length in the D2 direction as each other. The same can also be said for the two second regions R2 and the two third regions R3. The fourth region R4, for example, is positioned with the center of the length thereof in the D2 direction on the center line of the crossing region R0.

The third regions R3 have longer lengths (widths) in the D2 direction than any of the other regions within the crossing region R0. For example, the sum of the widths of the two third regions R3 may be greater than or equal to 50%, 80%, or 90% of the width of the crossing region R0. The size relationship between widths of the other regions within the crossing region R0 may be set as appropriate. In the illustrated example, in descending order of width, the order is the first region R1, the fourth region R4, and the second region R2.

The first to fourth regions R1 to R4 each have a rectangular shape with long sides parallel to the D1 direction, for example. However, the first to fourth regions R1 to R4 may alternatively each have a shape other than a rectangular shape. For example, in the case where the crossing region R0 has a parallelogram shape as described above, each of the first to fourth regions R1 to R4 may have a parallelogram shape having four sides that are parallel to the four sides of the crossing region R0. For specific dimensions of the first to fourth regions R1 to R4, refer to the details of the planar shape of the IDT electrode described below. The degrees of difference in velocity and so on between the first to fourth regions R1 to R4 may be set as appropriate. For the degree of differences in velocity and so on, see the details of the planar shape of the IDT electrode that affects the velocity (described below).

The busbar regions RB have a lower acoustic velocity than the first regions R1, in other words, have a lower acoustic velocity than any of the regions constituting the crossing region R0. The gap regions RG, for example, have a higher acoustic velocity than the fourth region R4, in other words, have a higher acoustic velocity than any of the regions constituting the crossing region R0. Because the gap regions RG have a higher velocity than the fourth region R4, the gap regions RG have a smaller area percentage occupied by the IDT electrode 5 than the fourth region R4. However, in FIG. 1 (and other figures discussed below), the changes in the width of the electrode fingers 11 are illustrated in an exaggerated manner, and as a result, the gap regions RG are illustrated as having a larger area percentage occupied by the IDT electrode 5 than the fourth region R4, which is different from the actual area percentage.

Details of Planar Shape of IDT Electrode

The first to fourth regions R1 to R4 (and gap regions RG) are specifically realized by the following shape for the electrode fingers 11.

The width (length in the D1 direction) of the parts of the electrode fingers 11 that are positioned in the third regions R3 is referred to as a standard width. Each electrode finger 11 includes, for example, the following parts in order from the side where tip of the electrode finger 11 is located in the longitudinal direction. A tip-side wider portion 11a having a larger width than the standard width. A tip-side main portion 11b having the standard width. A narrower portion 11c having a smaller width than the standard width. A base-side main portion 11d having the standard width. A base-side wider portion 11e having a larger width than the standard width. A base portion 11f having the standard width.

The third region R3 on the +D2 side consists of the region where the tip-side main portions 11b of the first electrode fingers 11A and the base-side main portions 11d of the second electrode fingers 11B overlap in the propagation direction. Similarly, the third region R3 on the −D2 side consists of the region where the base-side main portions 11d of the first electrode fingers 11A and the tip-side main portions 11b of the second electrode finger 11B overlap in the propagation direction.

The first region R1 on the +D2 side consists of the region where the tip-side wider portions 11a of the first electrode fingers 11A and the base-side wider portions 11e of the second electrode fingers 11B overlap in the propagation direction. Similarly, the first region R1 on the −D2 side consists of the region where the base-side wider portions 11e of the first electrode fingers 11A and the tip-side wider portions 11a of the second electrode fingers 11B overlap in the propagation direction.

As described above, in the third regions R3, the main portions having the standard width overlap each other, whereas in first regions R1, the wider portions having a larger width than the standard width overlap each other. As a result, the first regions R1 have a larger area percentage occupied by the IDT electrode 5 than the third regions R3. Consequently, the first regions R1 have a lower acoustic velocity than the third regions R3.

The base-side wider portions 11e of the second electrode fingers 11B extend further toward the −D2 side (the center of the crossing region R0) than the tip-side wider portions 11a of the first electrode fingers 11A. As a result, the base-side wider portions 11e of the second electrode fingers 11B overlap not only the tip-side wider portions 11a of the first electrode fingers 11A, but also parts of the tip-side main portions 11b of the first electrode fingers 11A in the propagation direction. The second region R2 on the +D2 side consists of the region where the base-side wider portions 11e and the tip-side main portions 11b overlap. The positions of the +D2-side ends of the tip-side wider portions 11a of the first electrode fingers 11A and the +D2-side ends of the base-side wider portions 11e of the second electrode fingers 11B, for example, roughly coincide with each other.

Similarly, the base-side wider portions 11e of the first electrode fingers 11A extend further toward the +D2 side (the center of the crossing region R0) than the tip-side wider portions 11a of the second electrode fingers 11B. As a result, the base-side wider portions 11e of the first electrode fingers 11A overlap in the propagation direction not only the tip-side wider portions 11a of the second electrode fingers 11B, but also parts of the tip-side main portions 11b of the second electrode fingers 11B. The second region R2 on the −D2 side consists of the region where the base-side wider portions 11e and the tip-side main portions 11b overlap. The positions of the −D2-side ends of the tip-side wider portions 11a of the second electrode fingers 11B and the −D2-side ends of the base-side wider portions 11e of the first electrode fingers 11A, for example, roughly coincide with each other.

As described above, in the third regions R3, the main portions having the standard width overlap each other in the propagation direction. In the first regions R1, the wider portions having a width larger than the standard width overlap each other in the propagation direction. On the other hand, in the second regions R2, the main portions and the wider portions overlap each other in the propagation direction. As a result, the area percentage occupied by the IDT electrode 5 in the second regions R2 is smaller than that in the first regions R1, and the area percentage occupied by the IDT electrode 5 in the second regions R2 is larger than that in the third regions R3. Consequently, the second regions R2 have a higher acoustic velocity than the first regions R1 and a lower acoustic velocity than the third regions R3.

The fourth region R4 consists of the region where the narrower portions 11c of the first electrode fingers 11A and the narrower portions 11c of the second electrode fingers 11B overlap each other in the propagation direction. In the third regions R3, the main portions having the standard width overlap each other, whereas in the fourth region R4, the narrower portions 11c having a smaller width than the standard width overlap each other. Therefore, the fourth region R4 has a smaller area percentage occupied by the IDT electrode 5 than the third regions R3. Consequently, the fourth region R4 has a higher acoustic velocity than the third regions R3.

In the gap regions RG, the gaps G1 on the tip sides of the first electrode fingers 11A and the base portions 11f of the second electrode fingers 11B overlap in the propagation direction. In FIG. 1, the degree to which the width of the narrower portions 11c is smaller than the width of the main portions is exaggerated, and in reality, the width of the narrower portions 11c is greater than ½ the width of the base portions 11f (the standard width in the illustrated example). As already mentioned, in the fourth region R4, the narrower portions 11c overlap each other in the propagation direction. Therefore, the gap regions RG have a smaller area percentage occupied by the IDT electrode 5 than the fourth region R4. Consequently, the gap regions RG have a higher acoustic velocity than the fourth region R4 (and the first to third regions R1 to R3). However, unlike in the illustrated velocity profile, the gap regions RG may have a lower acoustic velocity than the fourth region R4.

In the busbar regions RB, due to the busbars 9 extending in the D1 direction, the area percentage occupied by the IDT electrode 5 in the busbar regions RB is 100%. On the other hand, in the various regions between the pair of busbars 9, the area percentage of the IDT electrode 5 is less than 100% because the first electrode fingers 11A and the second electrode fingers 11B are spaced apart from each other. Therefore, the busbar regions RB have a lower acoustic velocity than any of the other regions within the region where the IDT electrode 5 is disposed.

For example, multiple openings arranged in the D1 direction may be formed in the busbars. In this case, the area percentage of the IDT electrode in the busbar regions would not be 100%, and consequently, the acoustic velocity in the busbar regions would be higher. However, this can be considered as a question of which portions of the IDT electrode are defined as the busbars and the busbar regions. For example, the parts of busbars, which contain multiple openings as described above, that are positioned further toward the crossing region R0 than the multiple openings may be considered as the busbars 9 in an embodiment.

Each of the multiple sections (11a to 11f) of the electrode fingers 11 extends, for example, through a constant width (in the D1 direction), and this results in steps being formed at the boundaries with the adjacent sections. In more detail, these steps have relatively short edges that extend roughly parallel to the D1 direction, for example. From another perspective, in the velocity profile, changes in velocity take place step-like manner. In reality, the corners of the steps may be rounded or the short edges may be curved due to machining errors or the like.

Unlike in the illustrated example, at least one of the multiple sections (11a to 11f) may include a part that extends with a constant width but the width of the part connected to an adjacent section varies so that the step is gradual. In other words, if the existence of multiple sections (11a to 11f) is clear from parts extending with constant widths, the boundaries between adjacent sections do not necessarily need to be clear. From another perspective, if the existence of multiple regions (R1 to R4) is clear in the velocity profile from ranges where the velocity is constant (in the D2 direction), the boundaries between adjacent regions do not necessarily need to be clear.

Unlike in the illustrated example, a step, as in the illustrated example, or a bend in the lateral edge of the electrode finger 11 may be formed at a boundary with an adjacent section among the multiple sections (11a to 11f), while the width of at least one of the above adjacent sections varies along the entire length of that one section. In other words, if the existence of multiple sections (11a to 11f) is evident from clear boundaries between adjacent sections, each section does not need to include a part extending with a constant width. From another perspective, if in the velocity profile, the boundaries of adjacent regions are clearly defined by steps or bends in the line representing the velocity and therefore the existence of multiple regions (R1 to R4) is evident, each region does not need to include a range where the velocity is constant (in the D2 direction).

Examples of Dimensions of Each Part of Electrode Fingers

The specific dimensions and so on of each part (11a to 11f) of the electrode fingers 11 may be set as appropriate. For example, this is described in more detail below. Hereafter, the ratio of the width (in the D1 direction) of the electrode fingers 11 to twice the pitch p (2p) of the electrode fingers 11 (=width/2p) may be referred to as the duty ratio.

The tip-side main portion 11b and the base-side main portion 11d account for the majority of the length (in the D2 direction) of each electrode finger 11. For example, the total length of the tip-side main portion 11b and the base-side main portion 11d may account for at least 50%, 80%, or 90% of the length of the electrode finger 11 (or the length of the crossing region R0 in the D2 direction). The lengths of the tip-side main portion 11b and base-side main portion 11d are roughly equal to each other. However, the base-side main portion 11d is shorter than the tip-side main portion 11b by the amount by which the base-side wider portion 11e is longer than the tip-side wider portion 11a.

In the illustrated example and in a mode different from the illustrated example (for example, mode in which the fourth region R4 are not formed), the term "total length of the tip-side main portion 11b and base-side main portion 11d" may be replaced by the term "length of a part having the standard width within the crossing region R0". The length of the tip-side main portion 11b and/or the base-side main portion 11d may be determined as a result of setting the total length of the electrode finger 11 (or the length of the crossing region R0 in the D2 direction) and the length of other parts of the electrode finger 11.

The width of the tip-side main portion 11b and the width of the base-side main portion 11d are identical to each other and are also equal to the standard width as described previously. The duty ratio of the standard width may be, for example, greater than or equal to 0.40 or 0.45, and less than or equal to 0.60 or 0.55. An appropriate combination of these upper and lower limits may be used.

The length of the tip-side wider portion 11a (in the D2 direction, in other words, the width of the first region R1)

may be, for example, greater than or equal to 0.5p, 1.0p, or 1.5p, and less than or equal to 4.0p, 3.0p, or 2.5p. An appropriate combination of these upper and lower limits may be used.

The difference between the length of the base-side wider portion 11e (in the D2 direction) and the length of the tip-side wider portion 11a (in other words, the width of the second region R2) may be, for example, greater than or equal to 0.1p or 0.3p, and less than or equal to 1p or 0.7p. An appropriate combination of these upper and lower limits may be used. From another perspective, the width of the second regions R2 may be, for example, greater than or equal to 0.1 or 0.2 times the width of the first regions R1, and may be less than 1 times or less than or equal to 0.5 or 0.3 times the width of the first regions R1. An appropriate combination of these upper and lower limits may be used. In the above example, the width of the second regions R2 is less than the width of the first regions R1, but the width of the second regions R2 may be greater than or equal to the width of the first regions R1.

The width of the tip-side wider portion 11a (in the D1 direction) and the width of the base-side wider portion 11e are identical to each other for example. However, these widths may be different from each other. The duty ratio of the width of these wider portions may be, for example, greater than or equal to 0.50, 0.55, or 0.60, and may be less than or equal to 0.80, 0.75, or 0.70, provided that the duty ratio is greater than the duty ratio of the standard width. An appropriate combination of these upper and lower limits may be used. From another perspective, the width of the wider portions may be, for example, greater than or equal to 1.1 or 1.2 times the standard width and may be less than or equal to 1.5 or 1.4 times the standard width. An appropriate combination of these upper and lower limits may be used.

The length of the narrower portions 11c (in the direction of D2, in other words, the width of the fourth region R4) may be, for example, greater than or equal to 0.2p, 0.5p, or 0.7p, and may be less than 3.0p, 1.5p, or 1.0p. An appropriate combination of these upper and lower limits may be used.

The duty ratio of the width (in the D1 direction) of the narrower portions 11c may be, for example, greater than or equal to 0.10, 0.30, or 0.35 and less than or equal to 0.50 or 0.45, provided that the duty ratio of the narrower portions 11c is less than the duty ratio of the standard width. An appropriate combination of these upper and lower limits may be used. From another perspective, the width of the narrower portions 11c may be, for example, greater than or equal to 0.50, 0.70, or 0.75 times the standard width and less than or equal to 0.95, 0.90, or 0.85 times the standard width. An appropriate combination of these upper and lower limits may be used.

The length of the base portions 11f (in the D2 direction, in other words, the width of the gap regions RG) may be, for example, greater than or equal to 0.1p, 0.2p, or 0.3p and may be less than or equal to 1.0p, 0.7p, or 0.5p. An appropriate combination of these upper and lower limits may be used.

The width of the base portions 11f (in the D1 direction) is, for example, the standard width (in other words, the same width as the width of the main portions) as previously described. However, the width of the base portions 11f may be smaller than or larger than the standard width. For example, the width of the base portions 11f may be the same as the width of the base-side wider portions 11e. In this case, the base-side wider portions 11e may be regarded as extending to the busbars 9.

(Various Example Configurations of Substrates Including Piezoelectric Body)

The piezoelectric body 3 having the top surface 3a on which the IDT electrode 5 is formed may constitute part of or the entirety of a substrate, for example. The substrate may have any of various configurations, for example, may have a known configuration. Hereafter, examples of the configuration of the substrate are described.

Figure 2:
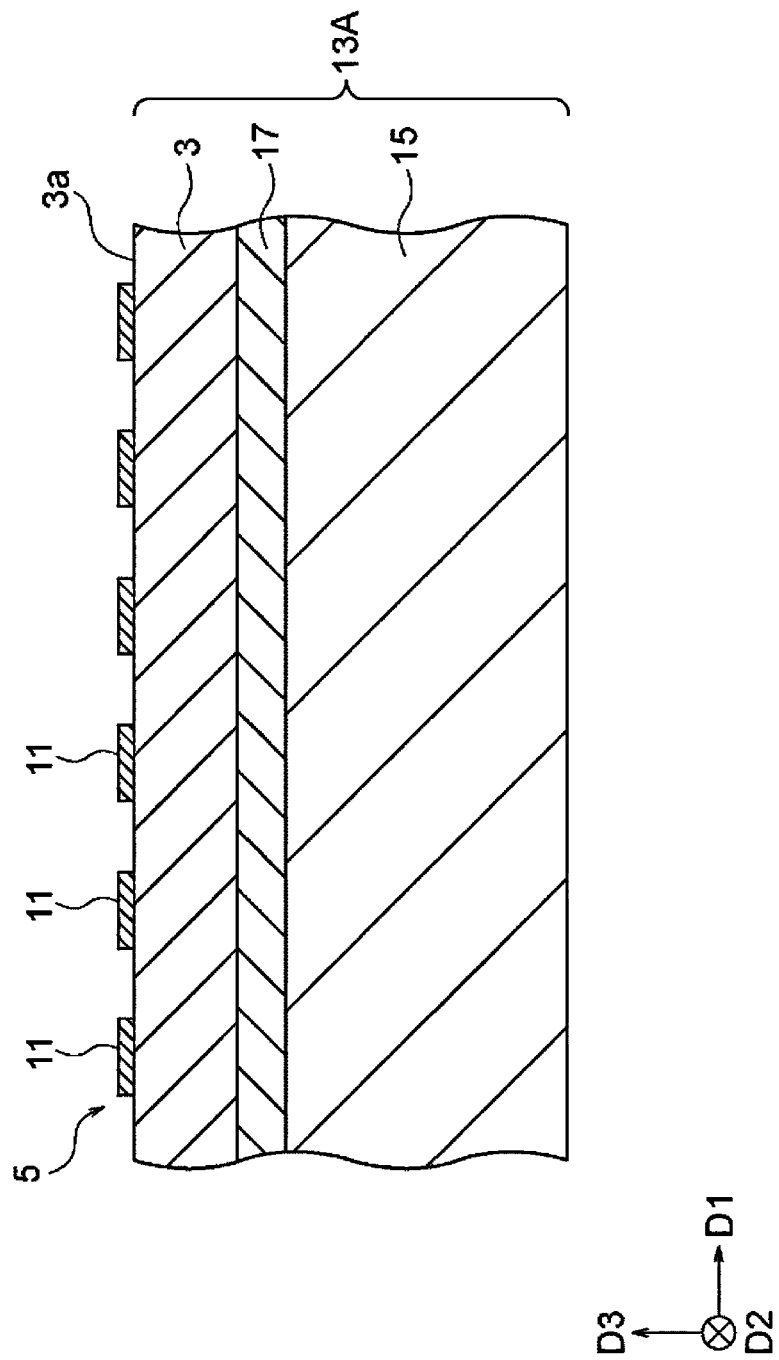
FIG. 2 is a diagram illustrating an example of a cross section taken along line II-II in FIG. 1.

FIG. 2 is a sectional view illustrating the configuration of a substrate 13A as a first example of a substrate. The illustrated cross section corresponds to a cross section taken along line II-II in FIG. 1.

The substrate 13A includes, for example, a support substrate 15, an intermediate layer 17 stacked on the top surface of the support substrate 15, and a piezoelectric body 3 stacked on the top surface of the intermediate layer 17. Here, the piezoelectric body 3 consists of a piezoelectric film. In the description of the configuration of the acoustic wave device, the words "plate", "layer", and "film" are assumed to have the same meaning, unless stated otherwise. The thickness of each layer is constant, for example, regardless of the position in planar directions (directions parallel to the D1-D2 plane).

The piezoelectric body 3 is composed of, for example, a single crystal having piezoelectric properties. For example, lithium tantalate ($LiTaO_3$, hereinafter may be abbreviated as LT), lithium niobate ($LiNbO_3$, hereinafter may be abbreviated as LN), and quartz ($SiO_2$) are examples of materials constituting such a single crystal. The piezoelectric body 3 may be composed of a polycrystalline material. The cut angle, planar shape, and various dimensions of the piezoelectric body 3 may be set as appropriate. For example, a piezoelectric body composed of LT or LN may be composed of a rotated Y-cut X-propagation crystal. In other words, the propagation direction of acoustic waves (D1 direction) and the X-axis may substantially coincide with each other (for example, the difference therebetween may be ±10°). The inclination angle of the Y axis to a normal (D3 direction) to the top surface 3a of the piezoelectric body 3 may be set as appropriate. The thickness of the piezoelectric body 3 may be, for example, greater than or equal to 0.1p or 0.3p and less than or equal to 2p or 1p. An appropriate combination of these upper and lower limits may be used.

The support substrate 15 may, for example, contribute to at least one of the following: increasing the strength of the substrate 13A, compensating for changes in properties caused by changes in temperature (temperature compensation), and confining acoustic waves to the piezoelectric body 3. Increased strength may be achieved, for example, by appropriately setting the thickness of the support substrate 15, which is composed of a material having a certain degree of strength. Temperature compensation may be achieved by, for example, making the coefficient of linear expansion of the support substrate 15 smaller than that of the piezoelectric body 3. Confinement of acoustic waves may be achieved by, for example, making the acoustic velocity of the support substrate 15 higher than that of the piezoelectric body 3 (and/or the intermediate layer 17) and/or by making the acoustic impedance of the support substrate 15 different from that of the intermediate layer 17.

The material and thickness of the support substrate 15 may be set as appropriate in light of the objectives described above. For example, the material of the support substrate 15 may be a semiconductor such as silicon (Si), a single crystal such as sapphire ($Al_2O_3$), or a ceramic such as sintered aluminum oxide ($Al_2O_3$). The thickness of the support substrate 15 is, for example, greater than or equal to 1p or 3p. The thickness of the support substrate 15 is, for example, greater than the thickness of the piezoelectric body 3.

The intermediate layer 17 may, for example, contribute to at least one of the following: increasing the bonding strength between the piezoelectric body 3 and the support substrate 15, and confining acoustic waves to the piezoelectric body 3. Increased bonding strength may be achieved by, for example, selecting a material for the intermediate layer 17 that has relatively high bonding strength with the piezoelectric body 3 and the support substrate 15 when using a prescribed bonding technique. Confinement of acoustic waves may be achieved, for example, by making the acoustic velocity of the intermediate layer 17 lower than that of the piezoelectric body 3 (and/or support substrate 15) and/or by making the acoustic impedance of the intermediate layer 17 different from that of the piezoelectric body 3 (and/or support substrate 15).

The material and thickness of the intermediate layer 17 may be set as appropriate in light of the objectives described above. For example, the material of the intermediate layer 17 may be silicon oxide ($SiO_2$). The thickness of the intermediate layer 17 may be, for example, greater than or equal to 0.01p or 0.1p, and may be less than or equal to 2p, 1p, or 0.5p. An appropriate combination of these upper and lower limits may be used. The thickness of the intermediate layer 17 is smaller than the thickness of the support substrate 15, for example. The thickness of the intermediate layer 17 may be smaller than, equal to, or greater than the thickness of the piezoelectric body 3.

As described above, the intermediate layer 17 may be a low acoustic velocity layer having a lower acoustic velocity than the piezoelectric body 3, and the support substrate 15 may be a high acoustic velocity layer having a higher acoustic velocity than the piezoelectric body 3. In this way, for example, leaking of acoustic waves from the piezoelectric body 3 can be reduced.

The term "acoustic velocity" used here may be, for example, the transverse acoustic velocity determined by the physical properties of each material. In other words, unlike the acoustic velocities used to distinguish the above-described first to fourth regions R1 to R4 from each other, the effect of the IDT electrode 5 may be ignored. The transverse acoustic velocity is obtained by taking the square root of the elastic modulus divided by the density. However, an acoustic velocity of the piezoelectric body 3 to be compared to the acoustic velocity of the intermediate layer 17 and the support substrate 15 may be the acoustic velocity in the third regions R3 of the acoustic waves of the mode being utilized instead of the transverse acoustic velocity. The acoustic velocity of the intermediate layer 17 and/or the support substrate 15 may be the acoustic velocity of bulk waves of a mode that has a relatively greater effect on leakage of the energy of acoustic waves of the utilized mode.

The combination of the material of the intermediate layer 17 serving as a low acoustic velocity layer and the material of the support substrate 15 serving as a high acoustic velocity layer may be chosen as appropriate. For example, the combination of these materials may be the combination of $SiO_2$ and Si described above. In the case where the intermediate layer 17 is provided as a low acoustic velocity layer, a layer that improves the bonding strength between the intermediate layer 17 and the piezoelectric body 3 may be provided and/or a relatively thin layer that improves the bonding strength between the intermediate layer 17 and the support substrate 15 may be provided.

Figure 3:
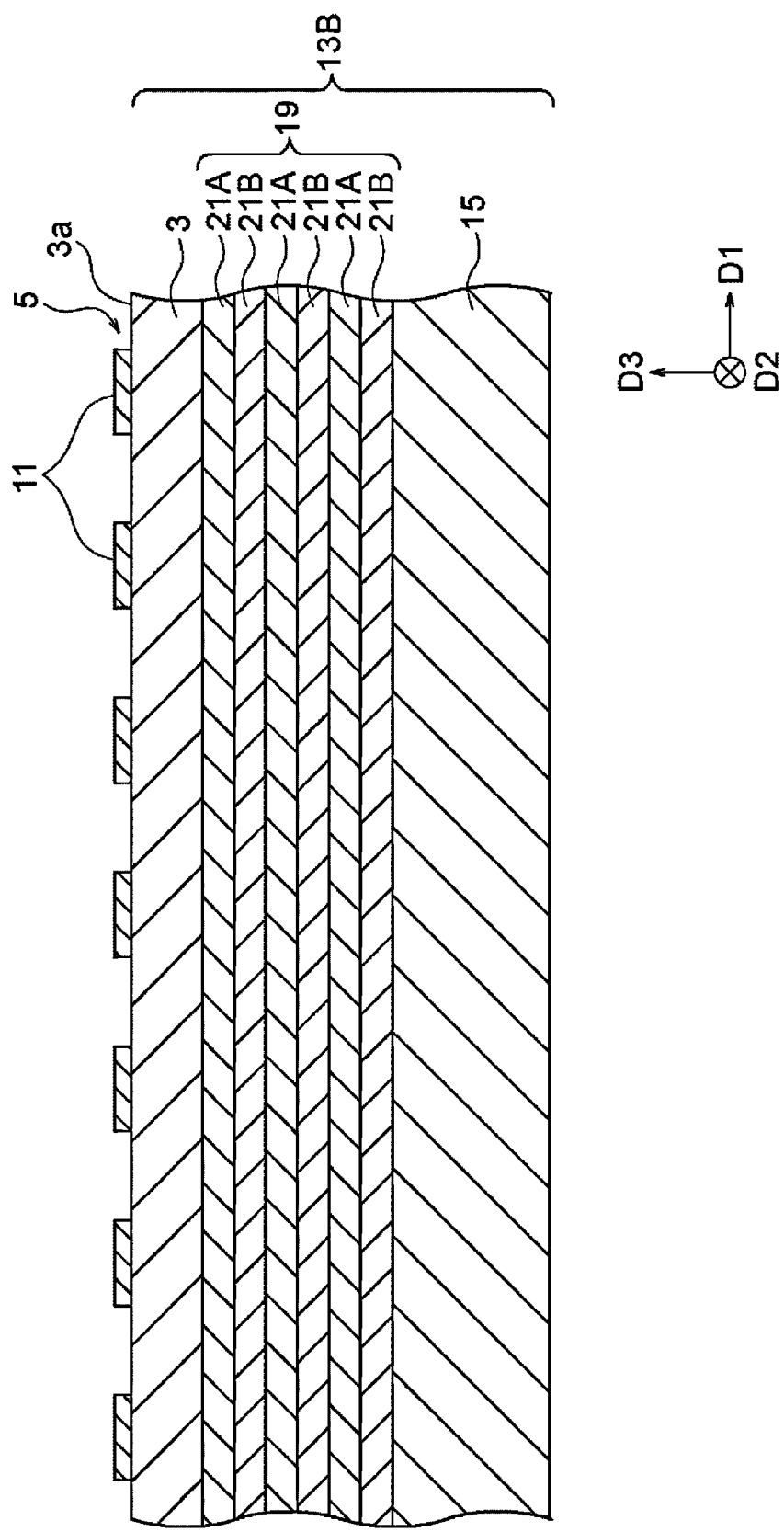
FIG. 3 is a diagram illustrating another example of a cross section taken along line II-II in FIG. 1.

FIG. 3 is a sectional view illustrating the configuration of a substrate 13B as a second example of a substrate. The illustrated cross section corresponds to a cross section taken along line II-II in FIG. 1.

The substrate 13B includes a multilayer film 19 instead of the intermediate layer 17 in the previously described substrate 13A. The multilayer film 19 includes two or more (six in the illustrated example) acoustic films (first films 21A and second films 21B). Among the multiple acoustic films, the materials of acoustic films that are adjacent to each other in the stacking direction (stacked without another acoustic film therebetween) are different from each other. From another perspective, adjacent acoustic films have different acoustic impedances from each other. As a result, for example, the reflectivity of acoustic waves at the boundary between two different layers is comparatively high. As a result, for example, leakage of acoustic waves propagating through the piezoelectric body 3 is reduced. The combination of the intermediate layer 17 and the support substrate 15 in the substrate 13A in FIG. 2 may be considered as a type of multilayer film. A multilayer film including the support substrate 15 may be defined in the substrate 13B in FIG. 3.

The number of different types of acoustic film materials and the number of acoustic films in the multilayer film 19 may be set as appropriate. In the illustrated example, the two types of acoustic films (first films 21A and second films 21B) are stacked in an alternating manner for three or more layers (more specifically, six layers). The materials of the acoustic films may be chosen as appropriate. For example, the material of the first films 21A may be silicon dioxide ($SiO_2$). The material of the second films 21B may be tantalum pentoxide ($Ta_2O_5$), hafnium oxide ($HfO_2$), zirconium dioxide ($ZrO_2$), titanium oxide ($TiO_2$), magnesium oxide (MgO), or silicon nitride ($Si_3N_4$). In this case, the first films 21A have a lower acoustic impedance than the second films 21B, for example. The thicknesses of the acoustic films may be set as appropriate, for example, the description of the thickness of the intermediate layer 17 above may be applied.

The acoustic films (first films 21A and second films 21B) may constitute low-acoustic-velocity films and high-acoustic-velocity films, similarly to the intermediate layer 17 and the support substrate 15 of the substrate 3A in FIG. 2. For example, the first films 21A may be composed of a material (for example, $SiO_2$ or $Ta_2O_5$) having a lower acoustic velocity than the piezoelectric body 3. The second films 21B may be composed of a material (for example, $Si_3N_4$) having a higher acoustic velocity than the piezoelectric body 3.

Although not specifically illustrated, a substrate containing the piezoelectric body 3 may have any of various configurations other than the above examples. For example, the substrate may be almost entirely constituted by the piezoelectric body 3. From another perspective, the piezoelectric body 3 may be relatively thick. The substrate may include a cavity below a relatively thin (for example, a thickness less than or equal to 2p or 1p) piezoelectric body 3. The substrate may also include, separately from the support substrate 15, a high acoustic velocity layer that stacked on the bottom surface of the intermediate layer 17 serving as a low acoustic velocity layer in the substrate 13A in FIG. 2. In contrast to the description of substrates 13A and 13B, confinement of acoustic waves may be realized by stacking a high acoustic velocity layer on the bottom surface of the piezoelectric body 3.

Other Configurations of Acoustic Wave Devices

Although not specifically illustrated, the acoustic wave device 1 may include an insulating protective film covering the top surface 3a of the piezoelectric body 3 from above the conductor layer including the IDT electrode 5. The protective film may, for example, contribute to reducing corrosion of the conductor layer and/or contribute to temperature compensation. For example, $SiO_2$, $Si_3N_4$ and Si can be used as the material of the protective film. The protective film may be a multilayer body consisting of these materials.

The device 1 may also include an additional film stacked on the top surface or the bottom surface of the IDT electrode 5. The additional film, for example, is stacked on part of or the entirety of the IDT electrode 5 and has a shape that fits within the IDT electrode 5 in planar perspective view. Such an additional film is composed of an insulating or metal material having different acoustic properties from the material of the IDT electrode 5, for example, and contributes to improving the reflection coefficient of acoustic waves.

The device 1 may be packaged as appropriate. The following can be given as examples of the configuration of the package. A package in which the substrate 13A (or 13B and so on) is mounted on a substrate, which is not illustrated, so that the top surface 3a of the piezoelectric body 3 faces the substrate with a gap therebetween, the substrate 13A being sealed with molding resin from above. Alternatively, a wafer-level package in which a box-shaped cover covering the top surface 3A is provided on the substrate 13A (or 13B and so on).

Summary of First Embodiment

As described above, the acoustic wave device 1 includes the piezoelectric body 3 and the IDT electrode 5. The piezoelectric body 3 has the first surface (top surface 3a). The IDT electrode 5 is positioned on the top surface 3a. The IDT electrode 5 includes multiple first electrode fingers 11A and multiple second electrode fingers 11B. The multiple second electrode fingers 11B are connected to a different potential from the multiple first electrode fingers 11A and are arranged so as to alternate with the multiple first electrode fingers 11A in the propagation direction of acoustic waves (D1 direction). The device 1 includes the crossing region R0 in which the multiple first electrode fingers 11A and the multiple second electrode fingers 11B overlap in the acoustic wave propagation direction. The crossing region R0 includes the first to third regions R1 to R3 (here the +D2 side is taken as an example). The first region R1 is positioned at the tip sides of the multiple first electrode fingers 11A. The second region R2 is positioned more centrally than the first region R1 in the direction in which the multiple first electrode fingers 11A and the multiple second electrode fingers 11B extend (D2 direction) and has a higher acoustic velocity than the first region R1. The third region R3 is positioned more centrally than the second region R2 and has a higher acoustic velocity than the second region R2.

Thus, for example, spurious can be reduced. Specifically, for example, the first region R1, which has a low acoustic velocity, is formed at the end of the crossing region R0 in the D2 direction, and therefore a piston mode (or a similar mode, the same applies hereinafter) can be used. As a result, transverse mode spurious can be reduced. Furthermore, the second region R2, which has a higher acoustic velocity than first region R1 and a lower acoustic velocity than the third region R3, is formed, and as a result, spurious can be further reduced. The applicant has confirmed this effect through actual measurements on test pieces and simulation calculations, and a number of examples will be described hereafter. The reason why spurious is reduced by the formation of the second regions R2 is that, for example, the effect of reducing transverse mode spurious is multiplied by the formation of two low-acoustic-velocity regions, which contribute to the realization of a piston mode.

The width (standard width) of the multiple first electrode fingers 11A and the multiple second electrode fingers 11B in the third region R3 are used for comparison. The first region R1 may include wider portions (in the first region R1 on the +D2 side, the tip-side wider portions 11a of the first electrode fingers 11A and the base-side wider portions 11e of the second electrode fingers 11B) in both the multiple first electrode fingers 11A and the multiple second electrode fingers 11B. The second region R2 may include the wider portions in one out of the multiple first electrode fingers 11A and the multiple second electrode fingers 11B (in the second region R2 on the +D2 side, the second electrode fingers 11B) and does not need to include the wider portions in the other one out of the multiple first electrode fingers 11A and the multiple second electrode fingers 11B (in the second region R2 on the +D2 side, the first electrode fingers 11A).

In this case, for example, the −D2-side end portions of the tip-side wider portions 11a of the first electrode fingers 11A and the −D2-side end portions of the base-side wider portions e of the second electrode fingers 11B are at different positions in the D2 direction. As a result, the reflection positions and/or diffraction positions of acoustic waves propagating in the transverse direction vary depending on the position in the D1 direction. Consequently, the probability of transverse acoustic waves strengthening each other is reduced and spurious is reduced. In addition, for example, the second region R2, which has a higher acoustic velocity than the first region R1 and a lower acoustic velocity than the third region R3, is easier to realize. This is described in more detail below, for example. As a different configuration from this embodiment, a configuration in which the width of the electrode fingers 11 in the second region R2 has a value that lies between the width of the electrode fingers 11 in the first region R1 and the width of the electrode fingers 11 in the third region R3 may be considered (this is also included in the technology according to the present disclosure). In this configuration, achieving such a width for the second region R2 may be difficult due to the machining accuracy with respect to the width of the electrode fingers 11. However, in this embodiment, the second region R2 can be realized in this case as well.

The tip-side wider portions (tip-side wider portions 11a) of the multiple first electrode fingers 11A may be located in the first region R1 on the +D2 side, and do not need to be located in the second region R2 on the +D2 side. The wider portions (base-side wider portions 11e) located at the bases of the multiple second electrode fingers 11B may be located in the first region R1 on the +D2 side and in the second region R2 on the +D2 side. In other words, the base-side wider portions 11e may extend further toward the center of the crossing region R0 in the D2 direction than the tip-side wider portions 11a.

In this case, for example, compared to a configuration in which the tip-side wider portions 11a extend further toward the center of the crossing region R0 in the D2 direction than the base-side wider portions 11e (such a configuration may also be included in the technology according to the present disclosure), the cross-sectional area of the electrode fingers 11 can be secured more easily on the side near the busbar 9. As a result, transmission of signals and/or heat between the busbars 9 and the electrode fingers 11 is facilitated.

The acoustic wave device 1 may further include the fourth region R4. The fourth region R4 may be positioned more centrally in the D2 direction than the third region R3, and may have a higher acoustic velocity than the third region R3.

In this case, for example, spurious can be further reduced. The applicant has confirmed this effect through actual measurements on test pieces and simulation calculations, and a number of examples will be described hereafter. The reason why spurious is reduced by the formation of the fourth region R4 is that, for example, the effect of reducing transverse mode spurious is multiplied by the formation of multiple regions in the acoustic velocity profile that contribute to the realization of the piston mode.

The length (width) of the fourth region R4 in the direction in which the multiple first electrode fingers 11A and the multiple second electrode fingers 11B extend (D2 direction) may be less than 1.5 times the pitch p of the multiple first electrode fingers 11A and the multiple second electrode fingers 11B.

In this case, for example, the characteristics of the acoustic wave device 1 are improved. The applicant has confirmed this effect through actual measurements on test pieces and simulation calculations, and a number of examples will be described hereafter. The reason why the characteristics are improved by the width of the fourth region R4 being less than 1.5p, is that, for example, the smaller width of the fourth region R4 allows the width of the third regions R3, which are responsible for the basic characteristics, to be more easily secured. For example, transverse mode acoustic waves with a wavelength (2p) equivalent to that of the acoustic waves that are intended to be utilized do not fit into the fourth region R4.

The acoustic wave device 1 may further include a low-acoustic-velocity film (intermediate layer 17 in FIG. 2 or first films 21A in FIG. 3) and a high-acoustic-velocity film (support substrate 15 in FIG. 2 or second films 21B in FIG. 3). The low-acoustic-velocity film is stacked on the opposite side of the piezoelectric body 3, which is composed of a piezoelectric film, from the top surface 3a of the piezoelectric body 3 and has a lower acoustic velocity than the piezoelectric body 3. The high-acoustic-velocity film is stacked on the opposite side of the low-acoustic-velocity film from the piezoelectric body 3 and has a higher acoustic velocity than the piezoelectric body 3.

In this case, for example, leaking of acoustic waves from the piezoelectric body 3 can be reduced. As a result, the characteristics of the device 1 are improved.

Second Embodiment

Figure 4:
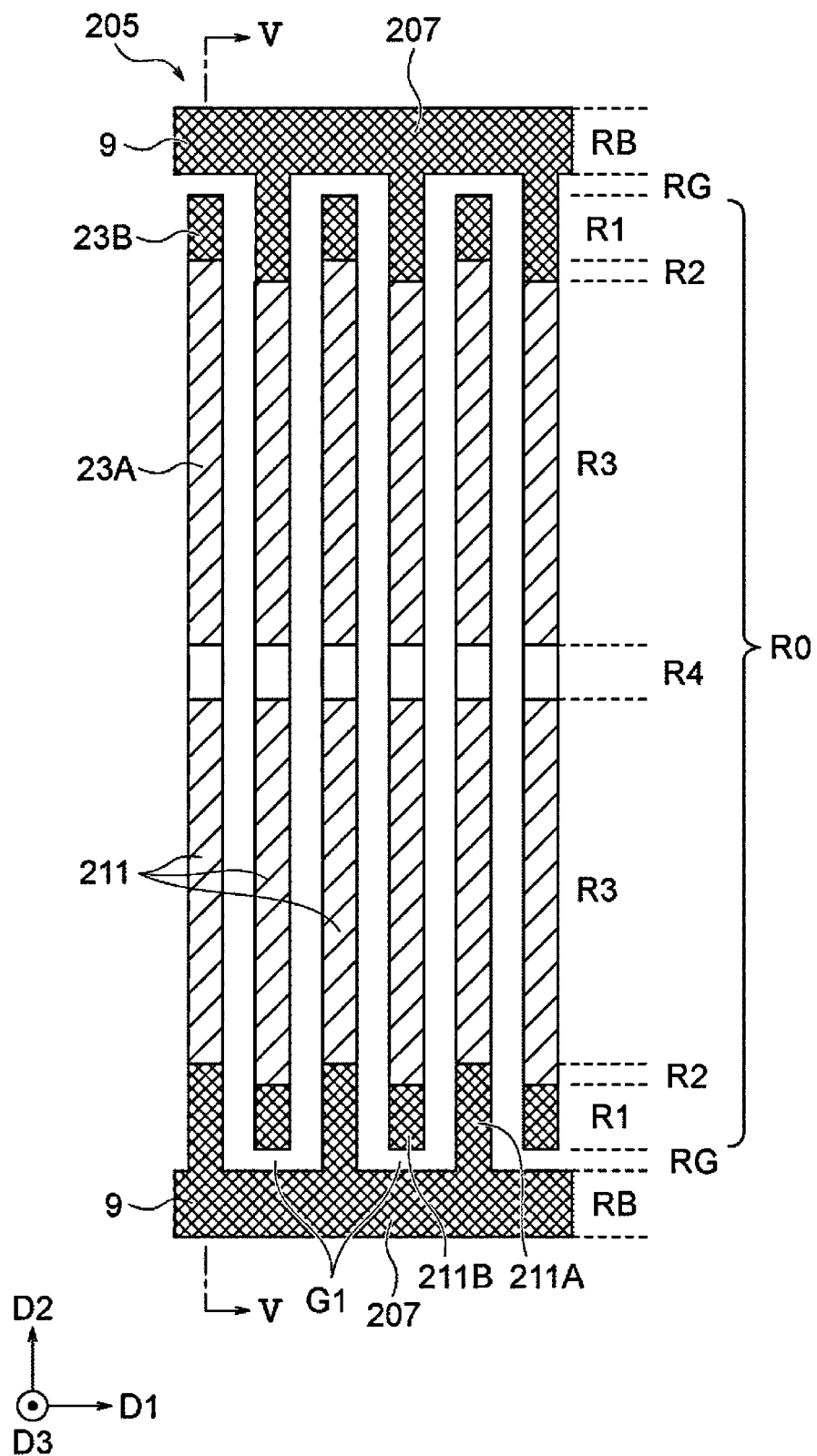
FIG. 4 is a plan view illustrating the configuration of an acoustic wave device according to a Second Embodiment.
Figure 5:
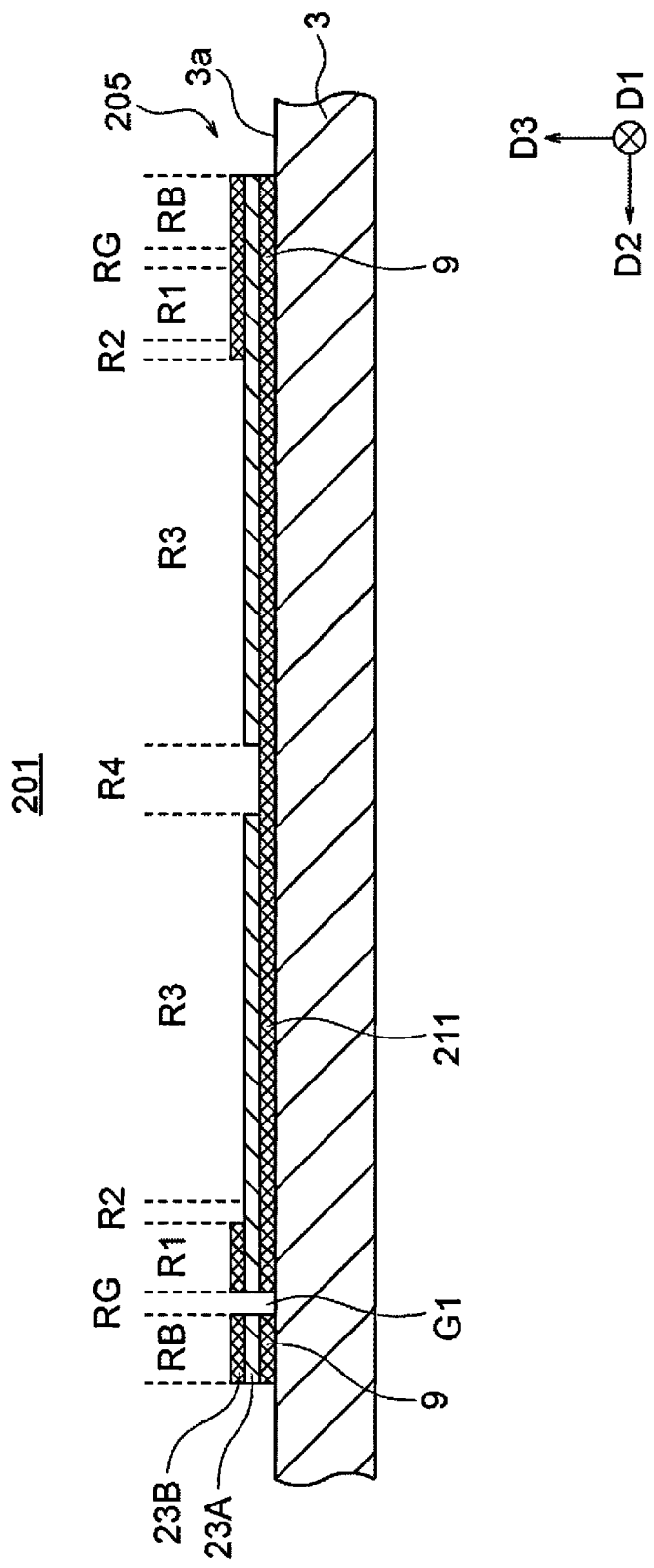
FIG. 5 is a sectional view taken along line V-V in FIG. 4.

FIG. 4 is a plan view illustrating the configuration of an acoustic wave device 201 according to a Second Embodiment (hereinafter, may be referred to as a "device 201"). FIG. 5 is a sectional view taken along line V-V in FIG. 4.

In FIG. 4, for convenience, the top surfaces (i.e., non-sectional surfaces) of a first additional film 23A and a second additional film 23B, which are described below, are shaded with hatching. In addition, in FIG. 4, for convenience, some of the symbols relating to an IDT electrode 205 are affixed to areas that are not visible because the areas are covered by the additional films. Unlike in the following description, the additional films may be considered to be part of the IDT electrode 205.

In the description of the First Embodiment, the acoustic velocity of the acoustic waves was described as being affected by the mass of members (for example, the IDT electrode 5) located on the top surface 3a of the piezoelectric body 3. In the First Embodiment, the mass on the top surface 3a is made different in the first to fourth regions R1 to R4 by changing the width of the electrode fingers 11, and in this way, the velocity profile in FIG. 1 is realized. In the Second Embodiment, the velocity profile in FIG. 1 is realized by providing additional films (first additional film 23A and second additional film 23B) stacked on parts of the electrode fingers 11, rather than by varying the width of the electrode fingers 11. This is described in more detail below.

The IDT electrode 205 includes a pair of comb electrodes 207, similarly to the IDT electrode 5 in the First Embodiment. The pair of comb electrodes 207 include busbars 9 and multiple electrode fingers 211 (multiple first electrode fingers 211A and multiple second electrode fingers 211B). However, the multiple electrode fingers 211 are different from the multiple electrode fingers 11 in the First Embodiment in that the electrode fingers 211 extend with a constant width along their entire length.

The first additional film 23A and second additional film 23B are stacked on top of the IDT electrode 205 in this order. The first additional film 23A is stacked on parts of the electrode fingers 211 corresponding to the tip-side wider portions 11a, the tip-side main portions 11b, the base-side main portions 11d, and the base-side wider portions 11e of the electrode fingers 11 in the First Embodiment. The second additional film 23B is stacked on parts of the electrode fingers 211 corresponding to the tip-side wider portions 11a and the base-side wider portions 11e of the electrode fingers 11 in the First Embodiment. Thus, similarly to as in the First Embodiment, first to fourth regions R1 to R4 having a similar velocity profile to that in FIG. 1 are realized.

In the illustrated example, the first additional film 23A and the second additional films 23B are stacked on the parts of the electrode fingers 211 that corresponds to the base portions 11f of the electrode fingers 11 in the First Embodiment. This corresponds to making the width of the base portions 11f equal to the width of the base-side wider portions 11e in the First Embodiment. However, similarly to the width of the base portions 11f being chosen as appropriate, the parts corresponding to the base portions 11f do not need to be provided with the first additional film 23A and/or the second additional film 23B.

In the illustrated example, the first additional film 23A and the second additional film 23B are stacked on the busbars 9. Unlike in the illustrated example, the first additional film 23A and/or the second additional film 23B do not need to be stacked on the busbars 9. The first and second additional films 23A and 23B may be provided or not provided at parts corresponding to the busbars 9 and the base portions 11f so that the acoustic velocity of the busbar regions RB is lower than the acoustic velocity of the gap regions RG.

An additional film was also mentioned in the First Embodiment. The description of the additional film in the First Embodiment may be applied to this embodiment. For example, unlike in the illustrated example, the additional film may be positioned on the bottom surface of the IDT electrode 5. The specific material and thickness of the additional film may be chosen as appropriate. For example, when the additional film material is an insulating material, examples of such a material include $Ta_2O_5$, $TaSi_2$, $W_5Si_2$, WC, and TiN. The thickness of the additional film may be, for example, greater than or equal to 0.01p and less than or equal to 0.2p.

As described above, in this embodiment, the crossing region R0 of the acoustic wave device 201 includes the first to third regions R1 to R3. Therefore, substantially the same effect as in the First Embodiment is achieved. For example, spurious can be reduced.

As illustrated in this embodiment, the first region R1 on the +D2 side may include an additional film (second additional film 23B) that is stacked on both the multiple first electrode fingers 211A and the multiple second electrode fingers 211B. The second region R2 on the +D2 side may include the second additional film 23B stacked on one out of the multiple first electrode fingers 211A and the multiple second electrode fingers 211B (second electrode fingers 211B), and does not need the second additional film 23B to be stacked on the other one (first electrode fingers 211A). The third regions R3 do not need to include the second additional film 23B on either the multiple first electrode fingers 211A or the multiple second electrode fingers 211B.

In a case in which regions having different acoustic velocities from each other are realized by using additional films in this way, the probability of a short circuit due to widening of the electrode fingers 11 and/or the probability of increased resistance due to narrowing of the electrode fingers 11, for example, is reduced. As a result, increasing the difference in acoustic velocity between regions is facilitated, for example. Compared to the Second Embodiment, additional films are not provided in the First Embodiment, and therefore the types of materials required can be reduced and the manufacturing process can be simplified. Consequently, the cost can be reduced.

Third Embodiment

Figure 6:
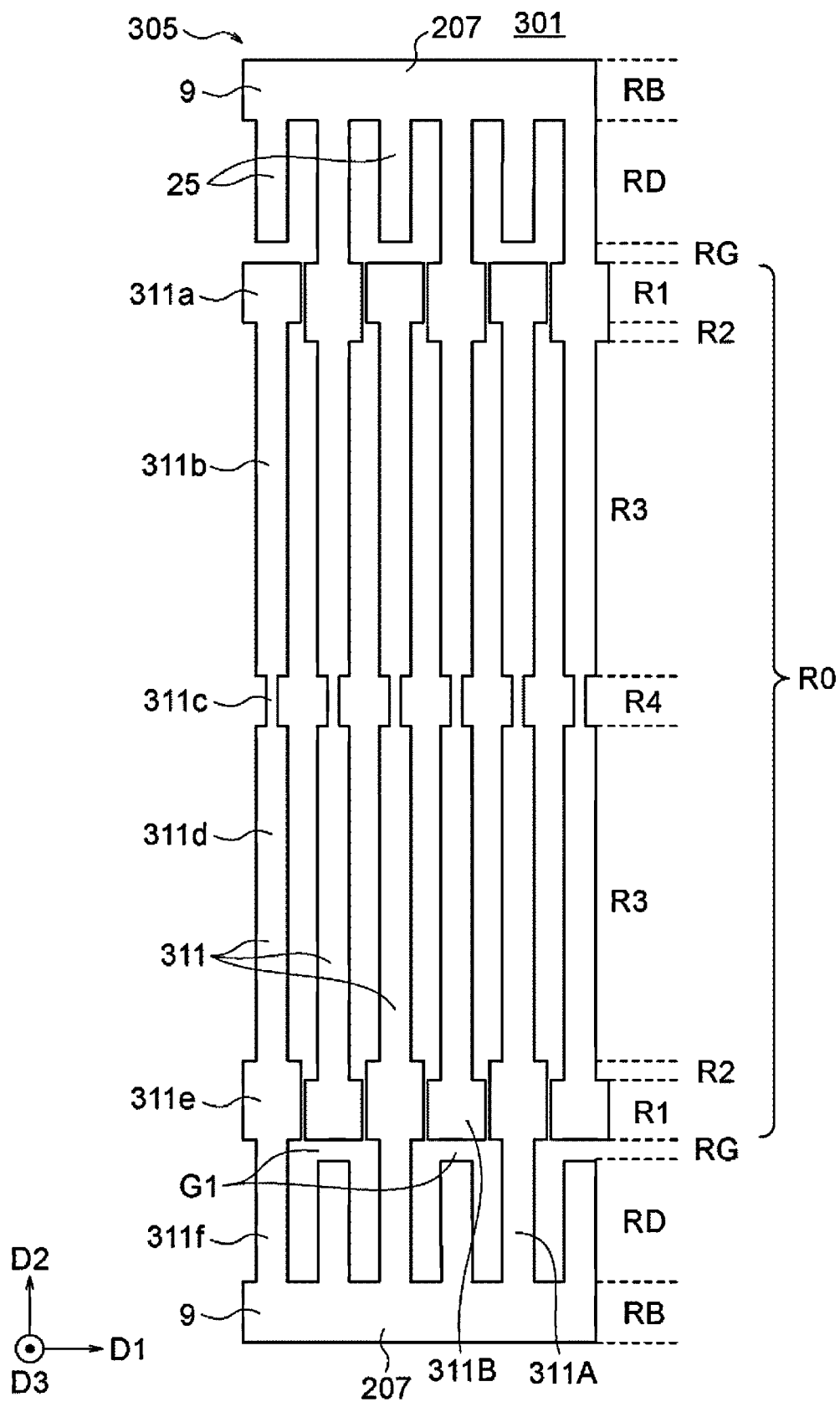
FIG. 6 is a plan view illustrating the configuration of an acoustic wave device according to a Third Embodiment.

FIG. 6 is a plan view illustrating the configuration of an acoustic wave device 301 according to a Third Embodiment (hereinafter, may be simply referred to as a "device 301").

In short, the device 301 is a device obtained by providing so-called dummy electrodes 25 in the device 1 of the First Embodiment. For example, this is described in more detail below.

An IDT electrode 305 of the device 301 includes a pair of comb electrodes 307, similarly to the IDT electrode 5 of the First Embodiment. The comb electrodes 307 each include a busbar 9 and multiple electrode fingers 311, similarly to the comb electrodes 7 of the First Embodiment. Each electrode finger 311 includes a tip-side wider portion 311a, a tip-side main portion 311b, a narrower portion 311c, a base-side main portion 311d, a base-side wider portion 311e, and a base portion 311f, similarly to the electrode fingers 11 in the First Embodiment.

Furthermore, each comb electrode 307 includes multiple dummy electrodes 25 extending parallel to the multiple electrode fingers 311 from the busbar 9, unlike in the First Embodiment. The tips of the dummy electrodes 25 of one comb electrode 307 face the tips of the electrode fingers 311 of the other comb electrode 307 across gaps G1. Unlike in the First Embodiment, the base portions 311f of the electrode fingers 311 have a length (in the D2 direction) that is the sum of the length of the gap G1 (in the D2 direction) and the length of the dummy electrode 25 (in the D2 direction).

As a result of providing the multiple dummy electrodes 25, dummy regions RD are formed between the gap regions RG and the busbar regions RB. The acoustic velocity in the dummy regions RD is lower than the acoustic velocity in the gap regions RG and higher than the acoustic velocity in the busbar regions RB, if additional films are not considered. However, the relationship may differ depending on additional films. For the sake of convenience, additional films are not considered in the description of this embodiment.

The shape of the dummy electrodes 25 (from another perspective, the acoustic velocity of the dummy regions RD) may be set as appropriate. In the illustrated example, the dummy electrodes 25 are roughly shaped so as to have a constant width and protrude in a direction perpendicular to the propagation direction of acoustic waves. In the illustrated example, the width of the dummy electrodes 25 is the same as the standard width of the electrode fingers 311 (width of the tip-side main portions 19a and so on). From another perspective, the acoustic velocity of the dummy regions RD is equal to the acoustic velocity of the third regions R3.

Unlike in the illustrated example, the width of the dummy electrodes 25 may be greater than or smaller than the standard width. For example, the width of the dummy electrodes may be the same as the width of the tip-side wider portions 311a. In this case, the width of the base portions 311f may be the same as or different from the width of the tip-side wider portions 311a. From another perspective, the acoustic velocity in the dummy regions RD may be lower than or higher than the acoustic velocity in the third regions R3. For example, the acoustic velocity in the dummy regions RD may be equal to the acoustic velocity in the first regions R1 or the second regions R2.

Unlike in the illustrated example, the width of the dummy electrodes 25 may vary with the position in the D2 direction. For example, the width of the dummy electrodes 25 may be larger at the tip or the base. From another perspective, the dummy regions RD may include two or more regions with different acoustic velocities from each other.

As described above, in this embodiment as well, the crossing region R0 of the acoustic wave device 301 includes the first to third regions R1 to R3. Therefore, substantially the same effect as in the First Embodiment is achieved. For example, spurious can be reduced.

As illustrated in this embodiment, the IDT electrode 305 may include multiple first dummy electrodes 25A and multiple second dummy electrodes 25B. The multiple first dummy electrodes 25A are connected to the same potential (same busbar 9) as the multiple first electrode fingers 311A, and their tips face the tips of the multiple second electrode fingers 311B across the gaps G1. The multiple second dummy electrodes 25B are connected to the same potential (same busbar 9) as the multiple second electrode fingers 311B, and their tips face the tips of the multiple first electrode fingers 311A across the gaps G1.

In this case, for example, in addition to the three or more types of regions with different acoustic velocities being provided within the crossing region R0, the number of regions with different acoustic velocities is increased outside the crossing region R0. In other words, the number of items that can be adjusted in the velocity profile is increased. As a result, for example, a reduction in spurious that cannot be reduced by only adjusting the velocity profile inside the crossing region R0 is facilitated.

Other Embodiments of Acoustic Wave Devices

Although not particularly illustrated, an acoustic wave device according to the present disclosure may be realized in various forms other than the First to the Third Embodiments. For example, this is described in more detail below.

The mass on the top surface 3a of the piezoelectric body 3 may be varied by making the thickness of the IDT electrode greater and/or smaller in parts of the IDT electrode, and the first to fourth regions R1 to R4 may be realized in this way. For example, changes in thickness due to the additional films in the third embodiment may be realized as changes in the thickness of the IDT electrode itself.

The changes in the width of the electrode fingers in the First Embodiment, the presence or absence of additional films in the Second Embodiment, and the changes in the thickness of the electrode fingers described above can be generically conceptualized as changes in mass per unit length, in the direction in which the electrode fingers extend, of the mass on the regions of the top surface 3a of the piezoelectric body 3 overlapping the electrode fingers. For convenience, in the following description, a part of an electrode finger whose mass per unit length has changed relative to a reference part of the electrode finger (for example, the main portion located in the third region) may be referred to as a mass-changed portion.

In the case where at least the bottom surface of an additional film (refer to the Third Embodiment) is insulating, the additional film may be positioned not only so as to be stacked on the multiple electrode fingers, but also between the multiple electrode fingers (may be stacked on the top surface 3a of the piezoelectric body 3). For example, the additional films in the Third Embodiment may be widened in the D1 direction while keeping the range in the D2 direction the same as in the Third Embodiment.

In the embodiments, the second regions R2 were realized by providing wider portions or additional films (mass-changed portions) at every other electrode finger in the array of multiple first electrode fingers and multiple second electrode fingers. However, as mentioned in the description of the First Embodiment, the second regions R2 may be realized by setting the width of all the electrode fingers to be between the width of the electrode fingers in the first regions R1 and the width of the electrode fingers in the third regions R3. This also applies to other mass-changed portions such as additional films.

The technique of providing a mass-changed portion (for example, a wider portion) at every other electrode finger in the second regions R2 may also be applied in regions other than the second regions R2. The technique of providing a mass-changed portion at every other electrode finger may be applied not only when increasing the mass with respect to the reference portions of the electrode fingers (for example, the main portions located in the third regions), but also when decreasing the mass. For example, in the fourth region in the First Embodiment, the narrower portions 11c may be provided at every other electrode finger. The mass-changed portions may be provided at every third or higher electrode fingers in the array of electrode fingers, rather than at every other electrode finger.

The various methods described thus far for varying the mass on the top surface 3a of the piezoelectric body 3 in multiple regions may be used in combination with each other as appropriate. For example, the electrode fingers may be provided with wider portions and additional films that are stacked on the wider portions and are not stacked on the main portions. For example, narrower portions may be provided without providing wider portions, and additional films may be provided only in the first and second regions R1 and R2 out of the first to fourth regions R1 to R4.

There may be three types of regions that are positioned within the crossing region R0 and have different acoustic velocities from each other. For example, the second regions R2 may be omitted. Specifically, taking the First Embodiment as an example, the length of the tip-side wider portions 11a and the length of the base-side wider portions 11e may be the same. In addition, for example, the fourth region R4 may be omitted. Taking the First Embodiment as an example, the tip-side main portion 11b and the base-side main portion 11d may be connected and configured as a single main portion without providing the narrower portion.

The first to fourth regions R1 to R4 in the embodiments are examples of first to fourth regions in the present disclosure. However, in a form where the second region R2 is omitted, the third region R3 may be taken as an example of the second region and the fourth region R4 as an example of the third region. In addition, in the embodiments, two adjacent regions, out of the first to fourth regions R1 to R4, may be regarded as an example of one region out of the first to third regions.

In contrast to the above description, there may be five or more types of regions that are positioned within the crossing region R0 and have different acoustic velocities from each other. For example, a fifth region that has a higher acoustic velocity than the second region R2 and a lower acoustic velocity than the third region R3 may be provided between the second region R2 and the third region R3. However, in this case, the second region R2 and the fifth region may be regarded as an example of the second region, or the fifth region and the third region R3 may be regarded as an example of the third region.

In the embodiments, within the crossing region R0, three or more types of regions were provided so that the acoustic velocity increases toward the center in the D2 direction. However, among such three or more types of regions, at least one or more types of regions may be inserted that do not follow the relationship that the acoustic velocity increases toward the center in the D2 direction. Such regions may be used, for example, to fine tune the characteristics of the acoustic wave device.

A generic concept that three or more types of regions having different acoustic velocities from each other are provided within the crossing region R0 can be extracted from the present disclosure. In this generic concept, providing three or more types of regions so that the acoustic velocity increases toward the center in the D2 direction is not essential.

Example Uses of Acoustic Wave Device

Acoustic wave devices may be used in various forms such as resonators and filters. Hereafter, example uses of acoustic wave devices will be described. Specifically, the description is generally given in the following order.
Example of Resonator
Example of Splitter
Example of Communication Device Resonators, splitters, and communication devices are all example uses of acoustic wave devices. In the description of the splitter, an example of a filter is also described as an example use of an acoustic wave device. In the following description, the acoustic wave device 1 of the First Embodiment is taken as an example of an acoustic wave device. However, other acoustic wave devices may be used, of course.

Example of Resonator

Figure 7:
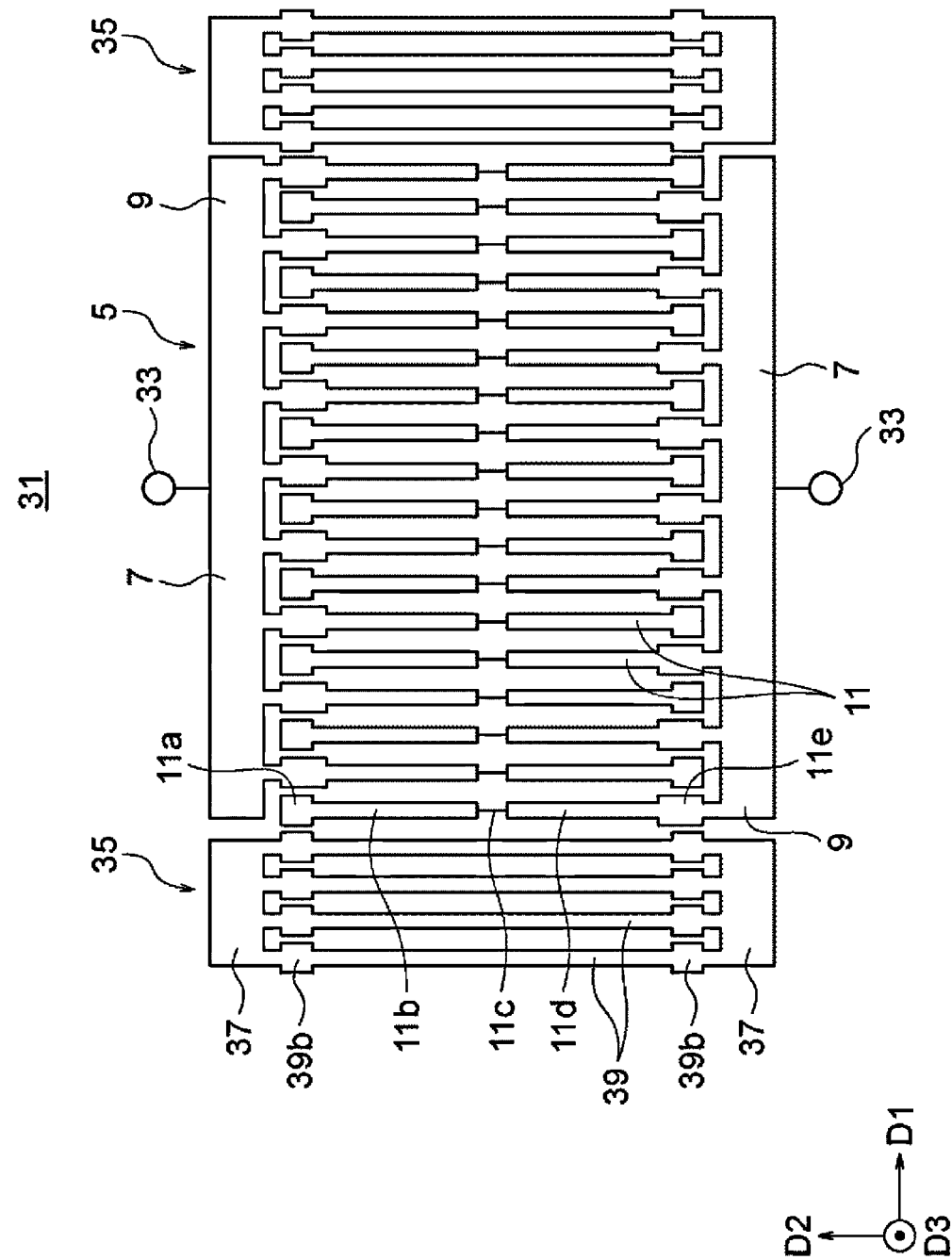
FIG. 7 is a plan view illustrating the configuration of an acoustic wave resonator according to an embodiment.

FIG. 7 is a plan view illustrating the configuration of a resonator 31.

The resonator 31 is configured as a so-called one-port acoustic wave resonator. The resonator 31 can generate resonance when input with an electrical signal of a prescribed frequency from one of two terminals 33, illustrated conceptually and schematically in FIG. 7, and can output a signal that generated the resonance from the other of the two terminals 33.

The resonator 31 includes, for example, the piezoelectric body 3 (refer to FIG. 2 and so on), as well as the IDT electrode 5 and a pair of reflectors 35 located on the top surface 3a of the piezoelectric body 3. The resonator 31 may be regarded as including the acoustic wave device 1 according to the First Embodiment, or may be regarded as being included in the device 1. The resonator 31 also includes piezoelectric body 3 (and other layers that affect acoustic waves), as described above. For convenience, however, the combination of the IDT electrode 5 and the pair of reflectors 35 may be referred to as the resonator 31.

The pair of reflectors 35 consists of the same conductor layer as the conductor layer constituting the IDT electrode 5, for example. In a form in which additional films overlap all or parts of the IDT electrode 5, additional films may be provided that overlap all or parts of the reflectors 35. The pair of reflectors 35 are positioned on both sides of the IDT electrode 5 in the propagation direction of acoustic waves. Each reflector 35 may be electrically floating or supplied with a reference potential, for example.

Each reflector 35 is formed in the shape of a lattice, for example. In other words, each reflector 35 includes a pair of busbars 37 facing each other and multiple strip electrodes 39 extending between the pair of busbars 37. Similarly to the multiple electrode fingers 11, the multiple strip electrodes 39 may be actually provided in a greater number than is illustrated.

The busbars 37 generally have substantially the same configuration as the busbars 9 of the IDT electrode 5, for example, and the description of the busbars 9 may be applied to the busbars 37. The busbars 37 are serially arranged with respect to the busbars 9 in the propagation direction of acoustic waves, for example. The width of the busbars 37 is identical to the width of the busbars 9.

Unlike in the illustrated example, the width of busbars 37 may be different from the width of the busbars 9. The busbars 37 may be at different positions in the D2 direction than the busbars 9. When the busbars 9 are inclined with respect to the propagation direction of acoustic waves, the busbars 37 may be inclined with respect to the propagation direction of acoustic waves similarly to the busbars 9 or may be parallel to the propagation direction of acoustic waves.

The schematic configuration of the multiple strip electrodes 39 is substantially the same as the schematic configuration of the electrode fingers 11 of the IDT electrode 5, except that the strip electrodes 39 span between the pair of busbars 37. The description of electrode fingers 11 may be applied to the strip electrodes 39 as appropriate. The multiple strip electrodes 39 are arranged in the propagation direction of acoustic waves so as to follow the arrangement of the multiple electrode fingers 11. The pitch of the multiple strip electrodes 39 and the pitch of the electrode fingers 11 adjacent to the reflectors 35 and the strip electrodes 39 adjacent to the IDT electrode 5 are identical to the pitch of the multiple electrode fingers 11, for example.

The specific planar shape of the strip electrodes 39 (or, from another perspective, the changes in the width (length in the D1 direction) depending on the position in the D2 direction) may be chosen as appropriate. In the illustrated example, the strip electrodes 39 are shaped so as to include wider portions 39b in regions obtained by extending the first regions R1 (refer to FIG. 1 and so on) in the D1 direction. The width of the portions other than the wider portions 39b is identical to the standard width of the electrode fingers 11 (width of the tip-side main portions 11b and so on), for example. The width of the wider portions 39b is identical to the width of the tip-side wider portions 11a and base-side wider portions 11e of the electrode fingers 11, for example. Due to the planar shape of the strip electrodes 39 as described above, two types of (three) regions having different acoustic velocities are formed in the regions obtained by extending the crossing region R0 (refer to FIG. 1 and so on) to the reflectors 35, although no particular symbols or the like are depicted.

Unlike in the illustrated example, the regions obtained by extending the crossing region R0 to the reflectors 35 may each include three or more types of regions having different acoustic velocities from each other. For example, the multiple strip electrodes 39 may be configured such that two types of wider portions having different lengths from each other in the D2 direction are arranged in an alternating manner, similarly to the electrode fingers 11. The multiple strip electrodes 39 may include narrower portions in the center in the D2 direction, similarly to the electrode fingers 11. The two types of wider portions and the narrower portion may be used in combination with each other. In contrast to the above description, the regions obtained by extending the crossing region R0 to the reflectors 35 may have a constant acoustic velocity. In other words, the strip electrodes 39 may have a constant width throughout their length. As can be understood from the illustrated example, the number and type of regions relating to acoustic velocity in the IDT electrode 5 and the number and type of regions relating to acoustic velocity in the reflectors 35 may be different from each other (illustrated example) or the same.

In the reflectors 35, similarly to as in the IDT electrode 5, the method for varying the mass on the top surface 3a of the piezoelectric body 3 is not limited to a method in which the width of the strip electrodes 39 is varied, and various other methods may be used. In one resonator 31, the same method (illustrated example) or different methods may be used to vary the mass in the IDT electrode 5 and the reflectors 35.

Example of Splitter

Figure 8:
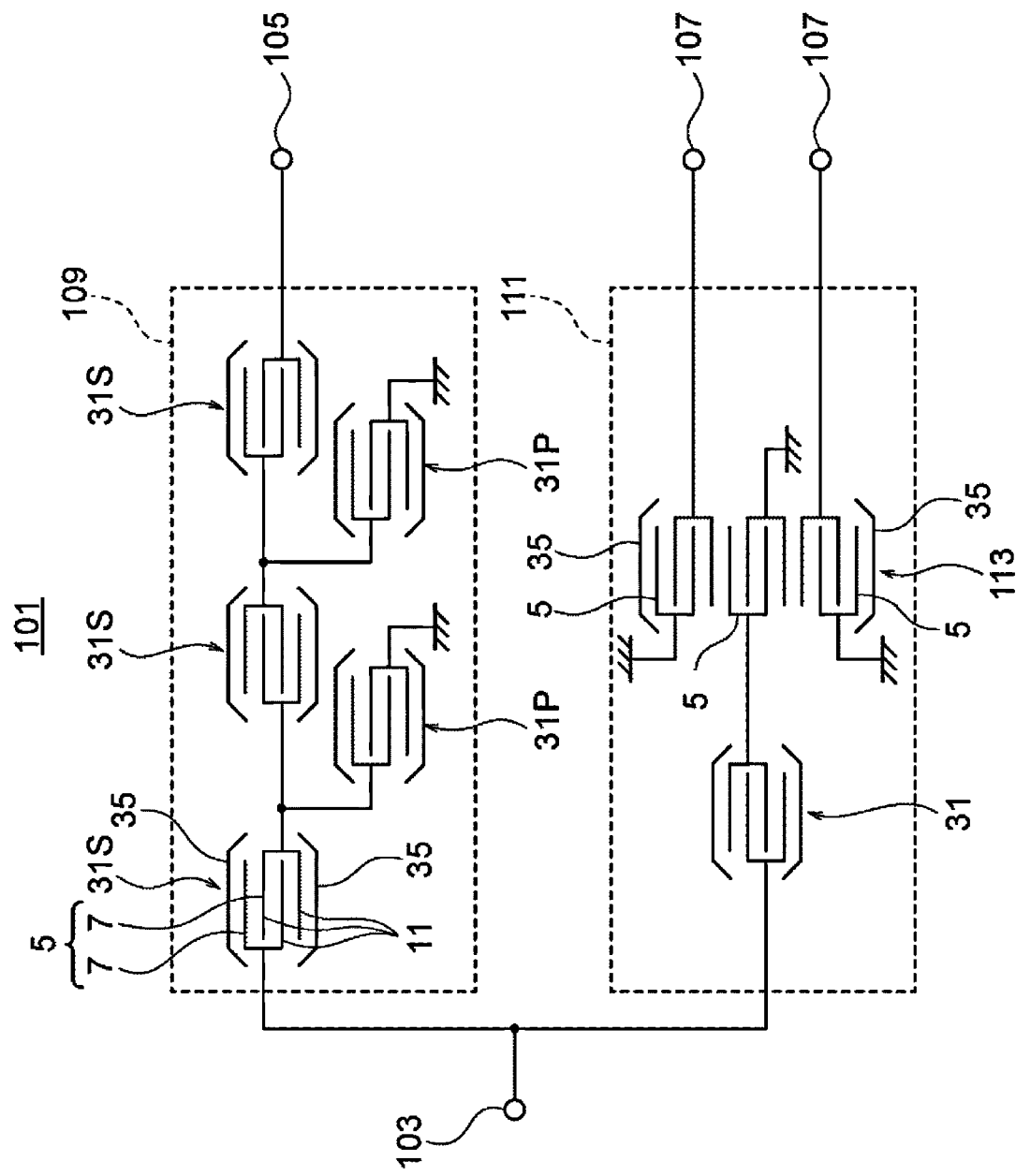
FIG. 8 is a circuit diagram schematically illustrating the configuration of a splitter according to an embodiment.

FIG. 8 is a circuit diagram schematically illustrating the configuration of a splitter 101 (for example, a duplexer). In this figure, the comb electrodes 7 are each schematically illustrated in the shape of a two-pronged fork, and the reflectors 35 are each represented by a single line bent at both ends, as indicated by the symbols in the upper left corner of the figure.

The splitter 101 includes, for example, a transmission filter 109 that filters a transmission signal from a transmission terminal 105 and outputs the filtered transmission signal to an antenna terminal 103, and a reception filter 111 that filters a reception signal from the antenna terminal 103 and outputs the filtered reception signal to a pair of reception terminals 107.

The transmission filter 109 is configured, for example, as a ladder filter consisting of multiple resonators 31 (series resonators 31S and parallel resonators 31P) connected to each other in a ladder configuration. In other words, the transmission filter 109 includes multiple (or just one) series resonators 31S connected in series with each other between the transmission terminal 105 and the antenna terminal 103, and multiple (or just one) parallel resonators 31P (parallel arms) connecting the series line (series arm) to a reference potential part (symbol omitted).

The reception filter 111 includes, for example, a resonator 31 and a multi-mode filter (which is assumed to include a dual-mode filter) 113. The multi-mode filter includes a dual-mode filter. The multi-mode filter 113 includes multiple (three in the illustrated example) IDT electrodes 5 arranged in the propagation direction of acoustic waves and a pair of reflectors 35 disposed on both sides of the IDT electrodes.

At least one of the multiple resonators of the transmission filter 109 (ladder filter) may include the acoustic wave device 1 (IDT electrode 5) according to the embodiment. In a representation based on the one IDT electrode 5 possessed by the device 1, the transmission filter 109 includes the device 1 and one or more other IDT electrodes (in the illustrated example, the other IDT electrodes are also the IDT electrode 5 according to the First Embodiment) located on the top surface 3*a* of the piezoelectric body 3 of the device 1 and connected to the one IDT electrode 5 in a ladder configuration to form a ladder filter.

At least one of the multiple IDT electrodes of the multi-mode filter 113 may include the acoustic wave device 1 (IDT electrode 5) according to the embodiment. In a representation based on the one IDT electrode 5 possessed by the device 1, the multi-mode filter 113 includes the device 1 and one or more other IDT electrodes (in the illustrated example, the other IDT electrodes are also the IDT electrode 5 according to the First Embodiment) located on the top surface 3*a* of the piezoelectric body 3 of the device 1 and arranged in the propagation direction of acoustic waves with respect to the one IDT electrode 5 to form a multi-mode filter.

Each of the splitter 101, the transmission filter 109 (ladder filter), the reception filter 111, and the multi-mode filter 113 may be considered to include the device 1 according to the First Embodiment, or may be considered to be included in the device 1.

The multiple IDT electrodes 5 (and reflectors 35) of the splitter 101 may be provided on a single piezoelectric body 3 (substrate) or provided so as to be distributed over two or more piezoelectric bodies 3. For example, the multiple resonators 31 constituting the transmission filter 109 may be located on the same piezoelectric body 3. Similarly, the resonator 31 and the multi-mode filter 113 constituting the reception filter 111 may be provided on the same piezoelectric body 3, for example. The transmission filter 109 and the reception filter 111 may be provided on the same piezoelectric body 3, for example, or on different piezoelectric bodies 3 from each other. In addition to the above, for example, the multiple series resonators 31S may be provided on the same piezoelectric body 3, and the multiple parallel resonators 31P may be provided on another piezoelectric body 3.

FIG. 8 is just an example of the configuration of the splitter 101. Therefore, for example, the reception filter 111 may be configured as a ladder filter similarly to the transmission filter 109. The transmission filter 109 may include the multi-mode filter 113. The splitter 101 is not limited to being a duplexer, and for example, may be a diplexer or may be a multiplexer containing three or more filters.

Communication Device

Figure 9:
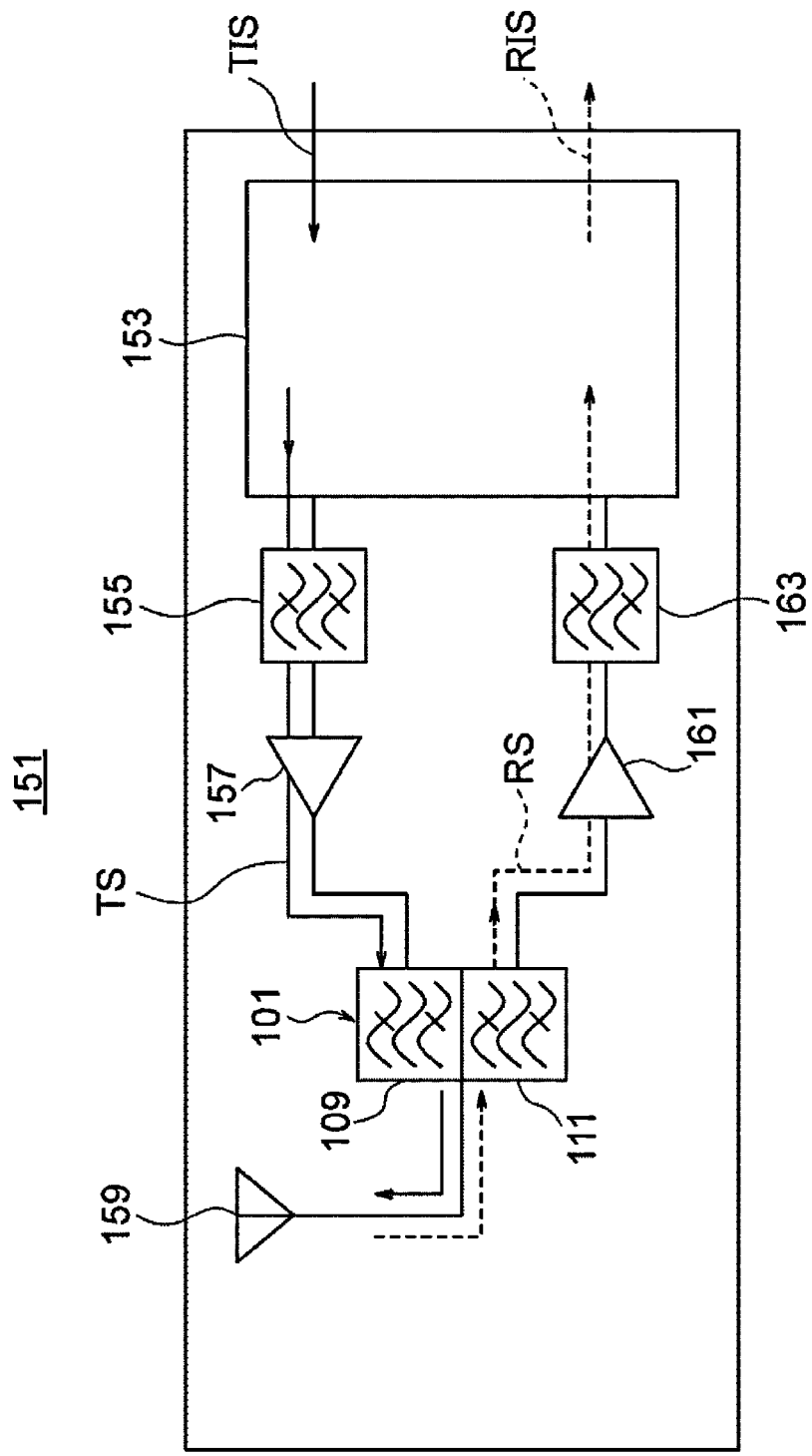
FIG. 9 is a block diagram illustrating the configuration of a communication device according to an embodiment.

FIG. 9 is a block diagram illustrating main parts of a communication device 151 as an example use of the acoustic wave device 1. The communication device 151 performs wireless communication using radio waves and includes the splitter 101.

In the communication device 151, a transmission information signal TIS, which contains information to be transmitted, is modulated and raised in frequency (converted to a radio-frequency signal having a carrier frequency) by a radio frequency integrated circuit (RF-IC) 153, and becomes a transmission signal TS. Unwanted components outside a transmission passband are removed from the transmission signal TS by a bandpass filter 155, and the resulting transmission signal TS is then amplified by an amplifier 157 and input to the splitter 101 (transmission terminal 105). The splitter 101 (transmission filter 109) removes unwanted components outside the transmission passband from the input transmission signal TS, and then outputs the transmission signal TS resulting from the removal from the antenna terminal 103 to an antenna 159. The antenna 159 converts the input electrical signal (transmission signal TS) into a radio signal (radio waves) and transmits the radio signal.

In the communication device 151, a radio signal (radio waves) received by the antenna 159 is converted into an electrical signal (reception signal RS) by the antenna 159 and input to the splitter 101 (antenna terminal 103). The splitter 101 (reception filter 111) removes unwanted components outside a reception passband from the input reception signal RS and outputs the resulting reception signal RS from the reception terminal 107 to an amplifier 161. The output reception signal RS is amplified by the amplifier 161, and unwanted components outside the reception passband are removed by a bandpass filter 163. The reception signal RS is then reduced in frequency and demodulated by the RF-IC 153, and becomes a reception information signal RIS.

The transmission information signal TIS and the reception information signal RIS may be low-frequency signals (baseband signals) containing appropriate information, for example, analog or digitized audio signals. The radio signal passband may be set as appropriate and may conform to any of various known standards. The modulation method may be phase modulation, amplitude modulation, frequency modulation, or a combination of any two or more of these methods. Although the direct conversion method is illustrated as an example, other types of circuit may be used as appropriate, for example, a double superheterodyne type circuit. FIG. 9 is a diagram schematically illustrating only the main parts, and a low-pass filter, an isolator, and so on may be added at appropriate positions, and the positions of amplifiers and so on may be changed.

The acoustic wave device 1 may be used in various forms other than those described above. For example, the acoustic wave device 1 may be used in a two-port resonator or in a transversal filter.

PRACTICAL EXAMPLES

The effect of the acoustic wave device 1 according to the embodiment was confirmed by measuring the characteristics of test pieces of the resonator 31 according to the embodiment (FIG. 7) and by calculating the characteristics of the resonator 31 through simulation. A number of examples are described below.

First Comparative Example and First Practical Example

Figure 10:
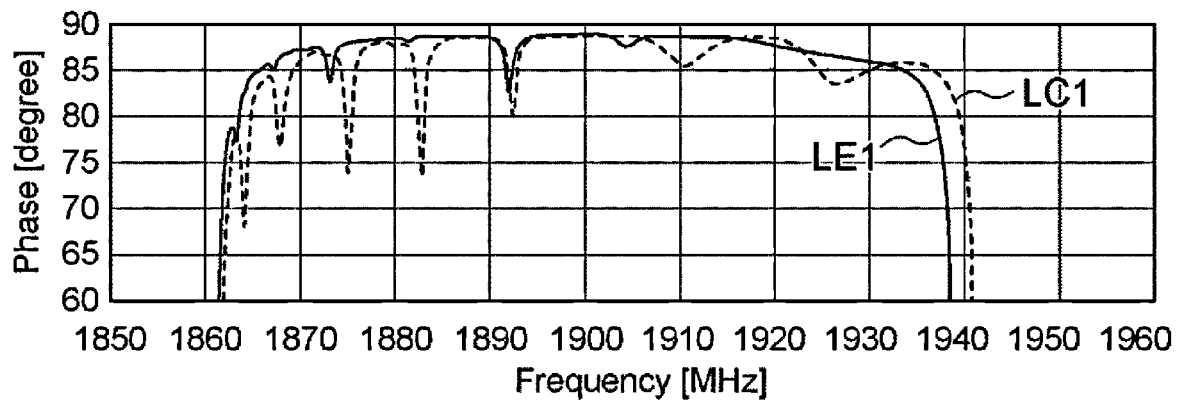
FIG. 10 is a diagram illustrating characteristics of resonators according to a First Comparative Example and a First Practical Example.

FIG. 10 is a diagram illustrating the characteristics of resonators according to a First Comparative Example and a First Practical Example.

In FIG. 10, the horizontal axis represents frequency. The vertical axis represents phase of impedance. A line LC1 represents a characteristic of the First Comparative Example. A line LE1 represents a characteristic of the First Practical Example. FIG. 10 is obtained by measuring the characteristics of test pieces.

The resonator 31 has a resonant frequency at which the absolute value of impedance is a minimum value and an anti-resonant frequency at which the absolute value of impedance is a maximum value. Generally, in the range between the resonant frequency and the anti-resonant frequency, the closer the phase of the impedance is to 90°, the better the characteristic of the resonator 31 is. Outside the above range, the closer the phase of the impedance is to −90°, the better the characteristic of the resonator 31 is. In FIG. 10, the range on the horizontal axis roughly corresponds to the range between the resonant frequency and the anti-resonant frequency.

The First Practical Example is substantially the same as the resonator 31 according to the First Embodiment. In the First Comparative Example, unlike in the First Practical Example, the electrode fingers 11 of the IDT electrode 5 and the strip electrodes 39 of the reflectors 35 have a constant width (standard width) along their entire lengths. The First Comparative Example differs from the First Practical Example in that the First Comparative Example includes dummy electrodes. Other parameters are generally the same in the First Comparative Example and the First Practical Example.

As illustrated in FIG. 10, the number of spurious components and the magnitudes of the spurious components are reduced in the First Practical Example compared to the First Comparative Example. In other words, the fact that spurious is reduced by forming the first to fourth regions R1 to R4 within the crossing region R0 was confirmed by actual measurements.

Parameters common to the First Comparative Example and the First Practical Example are listed below.
Piezoelectric body:
  Material: LT
  Cut angle: 50° rotated Y-cut X-propagation
  Thickness: 0.65 µm
Low acoustic velocity layer (intermediate layer 17):
  Material: $SiO_2$
  Thickness: 0.22 µm
High acoustic velocity layer (support substrate 15):
  Material: Si
  Thickness: sufficient thickness with respect to pitch p (200 µm)
IDT electrode:
  Material: multilayer structure consisting of Ti and Al
  Thickness:
    Ti: 60 Å
    Al: 1400 Å
  Electrode fingers:
    Number: 250
    Pitch: 1.03 µm
    Width of crossing region R0: 40p
Reflectors:
  Material and thickness: same as IDT electrode
  Strip electrodes:
    Number: 30 (one reflector)
    Pitch: same as pitch of electrode fingers
Other parameters in the First Practical Example are listed below.
First regions R1
  Electrode finger duty: 0.65
  Width (D2 direction) of one first region R1: 2.0 µm
Second regions R2
  Electrode finger duty: repetition of 0.65 and 0.50
  Width (D2 direction) of one second region R2: 0.5 µm
Third regions R3
  Electrode finger duty: 0.50
  Width (D2 direction) of one third region R3: 17.71 µm
Fourth region R4
  Electrode finger duty: 0.40
  Width (D2 direction) of fourth region R4: 0.78 µm
Gap regions RG
  Electrode finger duty: 0.50
  Width (D2 direction) of one gap region RG: 0.38 µm The configuration of the reflectors 35 of the First Practical Example is substantially the same as the configuration illustrated in FIG. 7. For the parameters of the strip electrodes 39 in the First Practical Example, refer to the parameters and so on of the first regions R1 and the third region R3 listed above.

The other parameters of the First Comparative Example are listed below.
Electrode finger duty: same as duty of third regions R3 of First Practical Example
Dummy electrodes:
  Length (D2 direction): 3.7 µm
  Duty: same as electrode finger duty
Width (D2 direction) of one gap region RG: 0.30 µm
Strip electrode duty: same as electrode finger duty Second Comparative Example and First Practical Example FIG. 11 is a diagram illustrating characteristics of resonators according to a Second Comparative Example and the First Practical Example (already described), and is similar to FIG. 10.

Figure 11:
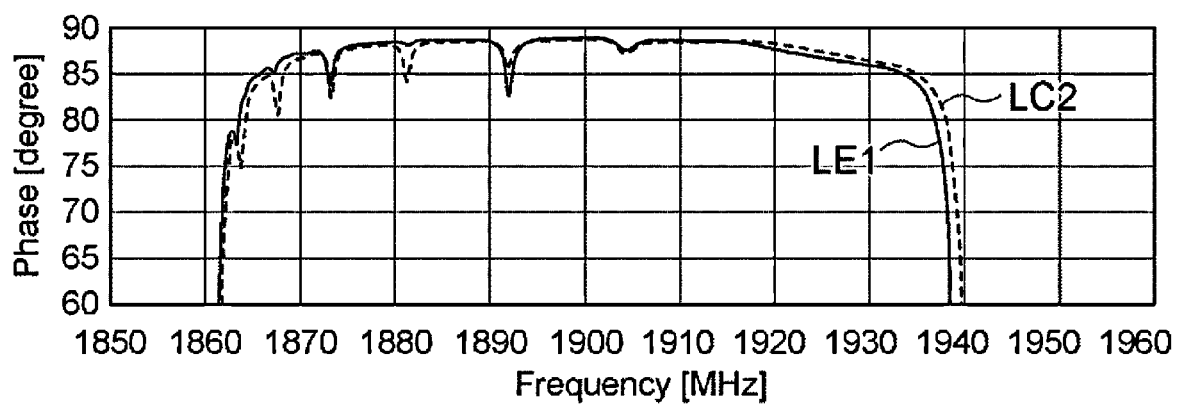
FIG. 11 is a diagram illustrating characteristics of resonators according to a Second Comparative Example and the First Practical Example.

FIG. 11 is obtained by measuring the characteristics of test pieces similarly to FIG. 10. In FIG. 11, a line LC2 represents a characteristic of the Second Comparative Example. A line LE1 represents the characteristic of the First Practical Example and is identical to the line LE1 illustrated in FIG. 10.

In the electrode fingers of the Second Comparative Example, unlike the electrode fingers 11 of the First Practical Example, the tip-side wider portions and the base-side wider portions have the same length as each other in the D2 direction. In the Second Comparative Example, the electrode fingers are not provided with narrower portions. In other words, in the Second Comparative Example, the crossing region includes only two types of (3) regions with different acoustic velocities from each other, similarly to an IDT electrode that uses a general piston mode. The strip electrodes of the reflectors in the Second Comparative Example, similarly to the strip electrodes of the reflectors in the First Comparative Example, have a constant width (standard width) along their entire length. Other parameters are generally the same in the First Comparative Example and the First Practical Example.

As illustrated in FIG. 11, the number of spurious components and the magnitudes of the spurious components are reduced in the First Practical Example compared to the First Comparative Example. In other words, the fact that spurious is reduced by forming the first to fourth regions R1 to R4 within the crossing region R0 was confirmed by actual measurements.

The previously mentioned parameters listed as being common parameters in the First Comparative Example and the First Practical Example are also common parameters in the Second Comparative Example and the First Practical Example. The width of the gap regions (in the D2 direction) in the Second Comparative Example is the same as the width of the gap regions in the First Practical Example. The other parameters of the Second Comparative Example are listed below.

Figure 12:
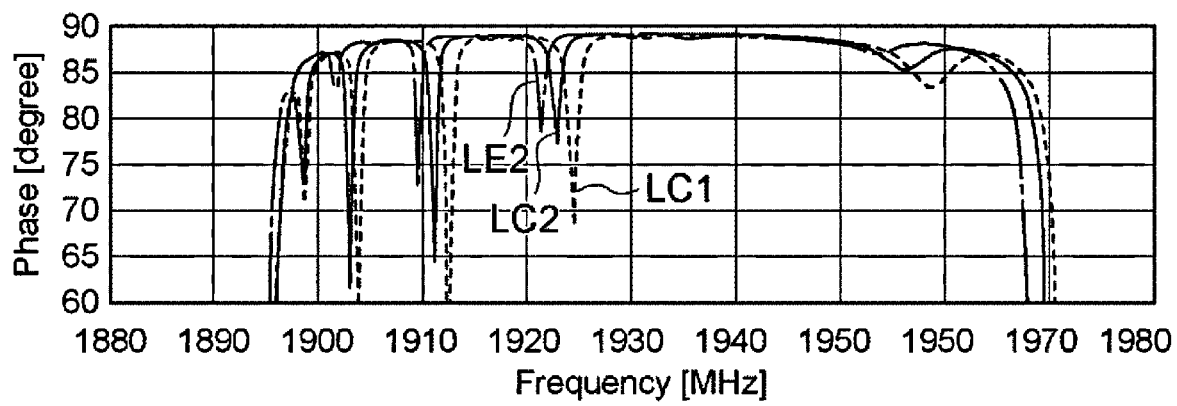
FIG. 12 is a diagram illustrating characteristics of resonators according to first and Second Comparative Examples and a Second Practical Example.

Low-acoustic-velocity regions (corresponds to first regions R1)
  Electrode finger duty: 0.65
  Width (D2 direction) of one low-acoustic-velocity region: 1.5 μm
Main region (region between two low-acoustic-velocity regions)
  Electrode finger duty: 0.50
  Width (D2 direction): 38.2 μm Second Practical Example FIG. 12 is a diagram illustrating the characteristics of resonators according to the First Comparative Example and the Second Comparative Example (already described) and a Second Practical Example, and is similar to FIG. 10.

FIG. 12 was obtained by performing simulation calculations, unlike FIGS. 10 and 11. In FIG. 12, lines LC1 and LC2 represent the characteristics of the first and Second Comparative Examples. A line LE2 represents a characteristic of the Second Practical Example. For convenience, the same symbols (LC1 and LC2) as in FIG. 10 and FIG. 11 are attached to the lines representing the characteristics of the first and Second Comparative Examples.

The Second Practical Example is the same as the First Practical Example except that the narrower portions 11c are not provided. In other words, in the Second Practical Example, the crossing region does not include the fourth region R4, but does include 3 types of (5) regions (corresponding to first to third regions R1 to R3) that have different acoustic velocities from each other. The rest of the configuration of the Second Practical Example is substantially the same as that of the First Practical Example.

As illustrated in FIG. 12, the magnitudes of spurious components are reduced in the Second Practical Example compared to the First and Second Comparative Examples. In other words, simulation calculations confirmed that spurious is reduced not only by forming regions corresponding to the first regions R1 and the third regions R3 in the crossing region R0, but also by forming second regions R2 (or, from another perspective, without forming the fourth region R4).

Third Practical Example

Figure 13:
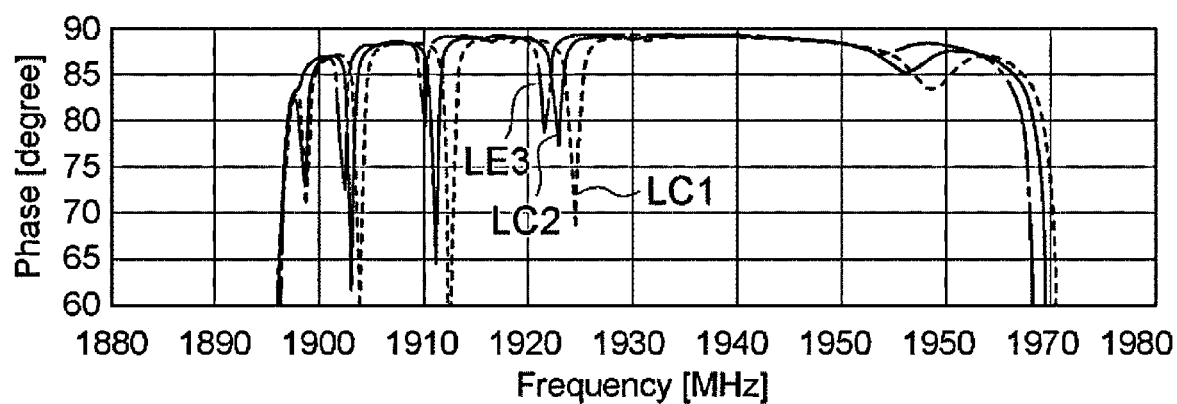
FIG. 13 is a diagram illustrating characteristics of resonators according to the first and Second Comparative Examples and a Third Practical Example.

FIG. 13 is a diagram illustrating the characteristics of resonators according to the First Comparative Example and the Second Comparative Example (already described) and a Third Practical Example, and is similar to FIG. 10.

FIG. 13 is obtained by performing simulation calculations similarly to FIG. 12. In FIG. 13, lines LC1 and LC2 represent the characteristics of the first and Second Comparative Examples and are identical to lines LC1 and LC2 in FIG. 12. A line LE3 represents a characteristic of the Third Practical Example.

In the Third Practical Example, the length of the base-side wider portions 11e (in the D2 direction) is the same as the length of the tip-side wider portions 11a in the First Practical Example. In other words, in the Second Practical Example, the crossing region does not include second regions R2, but includes 3 types of (5) regions (corresponding to first regions R1, third regions R3, and fourth region) that have different acoustic velocities from each other. The rest of the configuration of the Third Practical Example is substantially the same as that of the First Practical Example.

As illustrated in FIG. 13, the magnitudes of spurious components are reduced in the Third Practical Example compared to the First and Second Comparative Examples. In other words, simulation calculations confirmed that spurious is reduced not only by forming regions corresponding to the first regions R1 and the third regions R3 in the crossing region R0, but also by forming a fourth region R4 (or, from another perspective, without forming the second regions R2).

Fourth to Seventh Practical Examples

Figure 14:
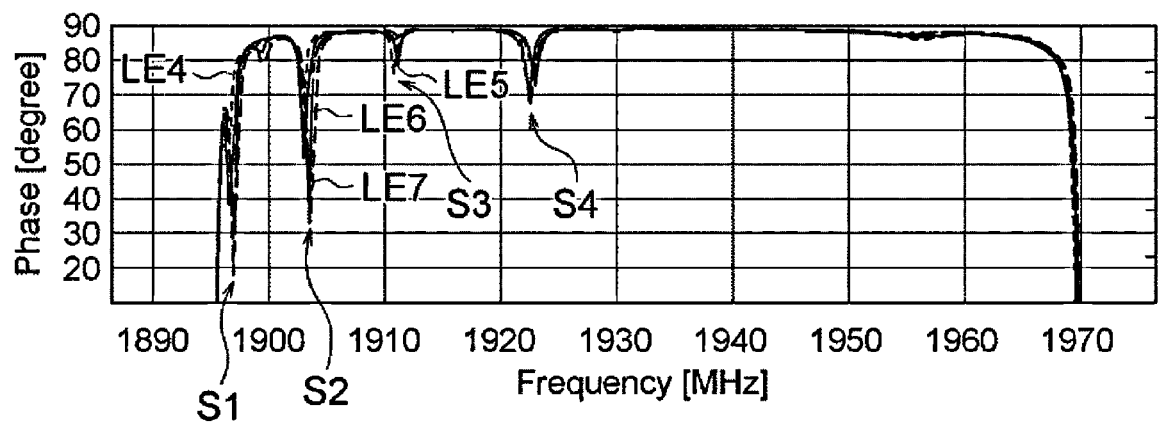
FIG. 14 is a diagram illustrating characteristics of resonators according to Fourth to Seventh Practical Examples.

FIG. 14 illustrates the characteristics of resonators according to Fourth to Seventh Practical Examples, and is similar to FIG. 10.

FIG. 14 is obtained by performing simulation calculations similarly to FIG. 12. In FIG. 14, lines LE4, LE5, LE6, and LE7 represent the characteristics of the Fourth, Fifth, Sixth, and Seventh Practical Examples.

The Fourth to Seventh Practical Examples are examples in which the width (length in the D2 direction) of the fourth region R4 is different from that in the First Practical Example. Specifically, the widths of the fourth region R4 are listed below.
  Fourth Practical Example: 0.5p
  Fifth Practical Example: 1.0p
  Sixth Practical Example: 1.5p
  Seventh Practical Example: 2.0p In the range of widths of the fourth region R4 listed above, the spurious is generally smaller, the smaller the width is. Since the lines LE4 to LE7 overlap each other in FIG. 14 making comparison difficult, the phase (°) of the impedance in each example for spurious S1 to S4 in the figure are listed below. The larger the value listed below, the smaller the spurious.

|     | 0.5 p | 1.0 p | 1.5 p | 2.0 p |
| --- | --- | --- | --- | --- |
| S1: | 52 | 38 | 22 | 19 |
| S2: | 65 | 52 | 39 | 33 |
| S3: | 77 | 78 | 86 | 87 |
| S4: | 76 | 73 | 69 | 67 |

REFERENCE SIGNS 1 acoustic wave device, 3 piezoelectric body, 3a top surface (first surface), 5 IDT electrode, 11a first electrode fingers, 11B second electrode fingers, R0 crossing region, R1 first region, R2 second region, R3 third region.

The invention claimed is:
1. An acoustic wave device comprising:
a piezoelectric body having a first surface; and
an interdigital transducer (IDT) electrode positioned on the first surface,
wherein the IDT electrode includes
  multiple first electrode fingers, and
  multiple second electrode fingers connected to a different potential from the multiple first electrode fingers and arranged in an alternating manner with the multiple first electrode fingers in a propagation direction of acoustic waves,
a crossing region in which the multiple first electrode fingers and the multiple second electrode fingers overlap in the propagation direction of acoustic waves includes a first region located at tip sides of the multiple first electrode fingers,
a second region located more centrally than the first region in a direction in which the multiple first electrode fingers and the multiple second electrode fingers extend and having a higher acoustic velocity than the first region, and
a third region located more centrally than the second region and having a higher acoustic velocity than the second region.

2. The acoustic wave device according to claim 1,
wherein when compared with a width of the multiple first electrode fingers and the multiple second electrode fingers in the third region,
both the multiple first electrode fingers and the multiple second electrode fingers include wider portions in the first region, and
either one out of the multiple first electrode fingers and the multiple second electrode fingers includes the wider portions and another one out of the multiple first electrode fingers and the multiple second electrode fingers does not include the wider portions in the second region.

3. The acoustic wave device according to claim 2,
wherein the wider portions located at the tip sides of the multiple first electrode fingers are located in the first region but are not located in the second region, and
the wider portions located at base sides of the multiple second electrode fingers are located in the first region and the second region.

4. The acoustic wave device according to claim 3,
wherein a fourth region is provided, the fourth region being located more centrally than the third region and having a higher acoustic velocity than the third region.

5. The acoustic wave device according to claim 3, further comprising:
a low-acoustic-velocity film stacked on an opposite side of the piezoelectric body from the first surface and having a lower acoustic velocity than the piezoelectric body, the piezoelectric body being composed of a piezoelectric film; and
a high-acoustic-velocity film stacked on an opposite side of the low-acoustic-velocity film from the piezoelectric film and having a higher acoustic velocity than the piezoelectric body.

6. The acoustic wave device according to claim 3, further comprising:
multiple first dummy electrodes connected to an identical potential to the multiple first electrode fingers, tips of the multiple first dummy electrodes facing tips of the multiple second electrode fingers across a gap; and
multiple second dummy electrodes connected to an identical potential to the multiple second electrode fingers, tips of the multiple second dummy electrodes facing tips of the multiple first electrode fingers across a gap.

7. The acoustic wave device according to claim 2,
wherein an additional film is stacked on both the multiple first electrode fingers and the multiple second electrode fingers in the first region,
the additional film is stacked on either one out of the multiple first electrode fingers and the multiple second electrode fingers in the second region but the additional film is not stacked on another out of the multiple first electrode fingers and the multiple second electrode fingers in the second region, and
the additional film is not stacked on the multiple first electrode fingers or the multiple second electrode fingers in the third region.

8. The acoustic wave device according to claim 2, further comprising:
a low-acoustic-velocity film stacked on an opposite side of the piezoelectric body from the first surface and having a lower acoustic velocity than the piezoelectric body, the piezoelectric body being composed of a piezoelectric film; and
a high-acoustic-velocity film stacked on an opposite side of the low-acoustic-velocity film from the piezoelectric film and having a higher acoustic velocity than the piezoelectric body.

9. The acoustic wave device according to claim 2, further comprising:
multiple first dummy electrodes connected to an identical potential to the multiple first electrode fingers, tips of the multiple first dummy electrodes facing tips of the multiple second electrode fingers across a gap; and
multiple second dummy electrodes connected to an identical potential to the multiple second electrode fingers, tips of the multiple second dummy electrodes facing tips of the multiple first electrode fingers across a gap.

10. The acoustic wave device according to claim 1,
wherein an additional film is stacked on both the multiple first electrode fingers and the multiple second electrode fingers in the first region,
the additional film is stacked on either one out of the multiple first electrode fingers and the multiple second electrode fingers in the second region but the additional film is not stacked on another out of the multiple first electrode fingers and the multiple second electrode fingers in the second region, and
the additional film is not stacked on the multiple first electrode fingers or the multiple second electrode fingers in the third region.

11. The acoustic wave device according to claim 10, further comprising:
multiple first dummy electrodes connected to an identical potential to the multiple first electrode fingers, tips of the multiple first dummy electrodes facing tips of the multiple second electrode fingers across a gap; and
multiple second dummy electrodes connected to an identical potential to the multiple second electrode fingers, tips of the multiple second dummy electrodes facing tips of the multiple first electrode fingers across a gap.

12. The acoustic wave device according to claim 1,
wherein a fourth region is provided, the fourth region being located more centrally than the third region and having a higher acoustic velocity than the third region.

13. The acoustic wave device according to claim 12,
wherein a length of the fourth region in a direction in which the multiple first electrode fingers and the multiple second electrode fingers extend is less than 1.5 times a pitch of the multiple first electrode fingers and the multiple second electrode fingers.

14. The acoustic wave device according to claim 1, further comprising:
a low-acoustic-velocity film stacked on an opposite side of the piezoelectric body from the first surface and having a lower acoustic velocity than the piezoelectric body, the piezoelectric body being composed of a piezoelectric film; and a high-acoustic-velocity film stacked on an opposite side of the low-acoustic-velocity film from the piezoelectric film and having a higher acoustic velocity than the piezoelectric body.

15. The acoustic wave device according to claim 1, further comprising:
multiple first dummy electrodes connected to an identical potential to the multiple first electrode fingers, tips of the multiple first dummy electrodes facing tips of the multiple second electrode fingers across a gap; and
multiple second dummy electrodes connected to an identical potential to the multiple second electrode fingers, tips of the multiple second dummy electrodes facing tips of the multiple first electrode fingers across a gap.

16. A filter comprising:
the acoustic wave device according to claim 1; and
one or more other IDT electrodes located on the first surface, connected to the IDT electrode in a ladder configuration, and constituting a ladder filter.

17. A splitter comprising:
an antenna terminal;
a transmission filter connected to the antenna terminal; and
a reception filter connected to the antenna terminal,
wherein at least one out of the transmission filter and the reception filter is constituted by the filter according to claim 16.

18. A communication device comprising:
the splitter according to claim 17;
an antenna connected to the antenna terminal; and
an integrated circuit (IC) connected to the transmission filter and the reception filter.

19. A filter comprising:
the acoustic wave device according to claim 1; and
one or more other IDT electrodes located on the first surface, arranged in the propagation direction of the acoustic waves with respect to the IDT electrode, and constituting a multi-mode filter.

* * * * *